United States Patent
Zhang

(10) Patent No.: US 10,412,688 B2
(45) Date of Patent: Sep. 10, 2019

(54) POWER CONTROL METHOD, TERMINAL, AND BASE STATION

(71) Applicant: Huawei Technologies Co., Ltd., Shenzhen (CN)

(72) Inventor: Xingwei Zhang, Beijing (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/809,607

(22) Filed: Nov. 10, 2017

(65) Prior Publication Data

US 2018/0084507 A1    Mar. 22, 2018

Related U.S. Application Data

(63) Continuation of application No. PCT/CN2015/078839, filed on May 13, 2015.

(51) Int. Cl.
*H04W 52/32*    (2009.01)
*H04W 72/04*    (2009.01)
(Continued)

(52) U.S. Cl.
CPC ......... *H04W 52/325* (2013.01); *H04W 52/10* (2013.01); *H04W 52/146* (2013.01);
(Continued)

(58) Field of Classification Search
CPC ... H04W 52/10; H04W 52/146; H04W 52/18; H04W 52/262; H04W 72/0473; H04W 72/0413; H03M 13/136; H04L 5/0048
See application file for complete search history.

(56) References Cited

U.S. PATENT DOCUMENTS 9,258,792 B2 *   2/2016   Yeon ................. H04W 72/0413
9,264,081 B1 *   2/2016   Cedergren .......... H04B 1/1027
(Continued)

FOREIGN PATENT DOCUMENTS

CN    102083189 A    6/2011
CN    102111863 A    6/2011
(Continued)

OTHER PUBLICATIONS

"Uplink power control procedures and Text Proposal for E-UTRA", 3GPP TSG RAN WG1 Meeting #51, Jeju, Korea, R1-074704, XP050108179, 3rd Generation Partnership Project, Valbonne, France (Nov. 5-9, 2007).
(Continued)

*Primary Examiner* — Dominic E Rego
(74) *Attorney, Agent, or Firm* — Leydig, Voit & Mayer, Ltd.

(57) ABSTRACT

A method, a terminal, and a base station are provided. The method includes: obtaining parameter information of a physical uplink control channel (PUCCH), where the parameter information includes one or more of quantity information of a resource block (RB), quantity information of a Reed-Muller (RM) code, quantity information of an orthogonal cover code (OCC), coding format information, modulation format information, and value information of a scale factor (SF) of the PUCCH, or the parameter information includes at least one configuration parameter corresponding to one or more of quantity information of an RB, quantity information of an RM code, quantity information of an OCC, coding format information, modulation format information, and value information of an SF; calculating transmit power of the PUCCH according to the parameter information; and transmitting the PUCCH according to the calculated transmit power.

9 Claims, 8 Drawing Sheets

(51) Int. Cl.
*H04W 52/14* (2009.01)
*H04W 52/18* (2009.01)
*H04W 52/10* (2009.01)
*H04W 52/26* (2009.01)
*H03M 13/13* (2006.01)
*H04L 5/00* (2006.01)

(52) U.S. Cl.
CPC ......... *H04W 52/18* (2013.01); *H04W 52/262* (2013.01); *H04W 72/0473* (2013.01); *H03M 13/136* (2013.01); *H04L 5/0048* (2013.01); *H04W 72/0413* (2013.01)

(56) References Cited

U.S. PATENT DOCUMENTS

| | | | | |
|---|---|---|---|---|
| 9,699,738 | B2* | 7/2017 | Ouchi | H04W 52/04 |
| 2009/0176525 | A1 | 7/2009 | Wang et al. | |
| 2010/0142467 | A1* | 6/2010 | Tiirola | H04L 5/0053 370/329 |
| 2010/0296460 | A1* | 11/2010 | Akimoto | H04L 1/0027 370/329 |
| 2012/0034948 | A1* | 2/2012 | Wang | H04W 52/0206 455/522 |
| 2012/0113907 | A1* | 5/2012 | Baldemair | H04W 52/146 370/329 |
| 2012/0281644 | A1* | 11/2012 | Hamaguchi | H04W 52/38 370/329 |
| 2013/0039272 | A1* | 2/2013 | Chen | H04W 76/25 370/328 |
| 2013/0128854 | A1* | 5/2013 | Nakashima | H04W 52/246 370/329 |
| 2013/0259011 | A1* | 10/2013 | Nakashima | H04W 72/0473 370/336 |
| 2013/0272157 | A1* | 10/2013 | Gao | H04W 52/146 370/252 |
| 2013/0286948 | A1* | 10/2013 | Gao | H04W 52/146 370/328 |
| 2013/0336272 | A1 | 12/2013 | Lin et al. | |
| 2014/0086182 | A1 | 3/2014 | Shin et al. | |
| 2014/0086193 | A1* | 3/2014 | Suzuki | H04W 52/50 370/329 |
| 2014/0135055 | A1* | 5/2014 | Fu | H04W 52/146 455/522 |
| 2014/0219226 | A1* | 8/2014 | Li | H04W 52/20 370/329 |
| 2014/0241301 | A1* | 8/2014 | Nakashima | H04W 52/365 370/329 |
| 2014/0247796 | A1* | 9/2014 | Ouchi | H04L 5/0053 370/329 |
| 2014/0321337 | A1* | 10/2014 | Kim | H04L 5/0053 370/280 |
| 2014/0329553 | A1* | 11/2014 | Nakashima | H04W 52/365 455/522 |
| 2015/0003390 | A1 | 1/2015 | Cheng et al. | |
| 2015/0043465 | A1* | 2/2015 | Ouchi | H04W 16/28 370/329 |
| 2015/0049682 | A1* | 2/2015 | Seo | H04W 52/146 370/329 |
| 2015/0078314 | A1* | 3/2015 | Choi | H04W 72/04 370/329 |
| 2015/0085716 | A1* | 3/2015 | Zhang | H04W 52/146 370/280 |
| 2015/0085787 | A1* | 3/2015 | Ouchi | H04L 5/0037 370/329 |
| 2015/0124673 | A1* | 5/2015 | Ouchi | H04W 52/146 370/311 |
| 2015/0215964 | A1* | 7/2015 | Damnjanovic | H04L 1/1607 370/329 |
| 2015/0223231 | A1* | 8/2015 | Noh | H04L 5/0048 370/329 |
| 2015/0223234 | A1* | 8/2015 | Seo | H04W 52/146 370/329 |
| 2015/0305041 | A1* | 10/2015 | Kim | H04W 72/085 370/329 |
| 2015/0327321 | A1* | 11/2015 | Dai | H04W 76/27 370/329 |
| 2016/0212712 | A1 | 7/2016 | Chen et al. | |
| 2017/0155533 | A9* | 6/2017 | Zhang | H04L 1/1671 |

FOREIGN PATENT DOCUMENTS

| | | |
|---|---|---|
| CN | 103312446 A | 9/2013 |
| CN | 104519561 A | 4/2015 |
| JP | 2010041379 A | 2/2010 |
| JP | 2011507357 A | 3/2011 |
| WO | 2010143478 A1 | 12/2010 |

OTHER PUBLICATIONS

"Dual RM segmentation and format 3 power control", 3GPP TSG RAN WG1 Meeting #63bis Dublin, Ireland, R1-110045, XP050490024, 3rd Generation Partnership Project, Valbonne, France (Jan. 17-21, 2011).

"3rd Generation Partnership Project; Technical Specification Group Radio Access Network; Evolved Universal Terrestrial Radio Access (E-UTRA); Physical channels and modulation (Release 12)," 3GPP TS 36.211 V12.5.0, 3rd Generation Partnership Project, Valbonne, France (Mar. 2015).

"3rd Generation Partnership Project; Technical Specification Group Radio Access Network; Evolved Universal Terrestrial Radio Access (E-UTRA); Physical layer procedures (Release 12)," 3GPP TS 36.213 V12.5.0, 3rd Generation Partnership Project, Valbonne, France (Mar. 2015).

"3rd Generation Partnership Project; Technical Specification Group Radio Access Network; Evolved Universal Terrestrial Radio Access (E-UTRA); Radio Resource Control (RRC); Protocol specification (Release 12)," 3GPP TS 36.331 V12.5.0, 3rd Generation Partnership Project, Valbonne, France (Mar. 2015).

"Power control for up to 32 component carriers," 3GPP TSGRAN WG1 Meeting #80bis, R1-151875, Belgrade, Serbia, XP050934733, pp. 1-3, 3rd Generation Partnership Project—Valbonne, France (Apr. 20-24, 2015).

\* cited by examiner

100

Obtain parameter information of a physical uplink control channel PUCCH, where the parameter information includes one or more of quantity information of a resource block RB, quantity information of an RM code, quantity information of an orthogonal cover code OCC, coding format information, modulation format information, or value information of a scale factor SF of the PUCCH, or the parameter information includes at least one configuration parameter corresponding to one or more of quantity information of an RB, quantity information of an RM code, quantity information of an OCC, coding format information, modulation format information, or value information of an SF of the PUCCH  ~ 110

Calculate transmit power of the PUCCH according to the parameter information  ~ 120

Transmit the PUCCH according to the calculated transmit power of the PUCCH  ~ 130

110 — Obtain parameter information of a physical uplink control channel (PUCCH), where the parameter information includes one or more of quantity information of a resource block (RB), quantity information of an RM code, quantity information of an orthogonal cover code (OCC), coding format information, modulation format information, or value information of a scale factor (SF) of the PUCCH, or the parameter information includes at least one configuration parameter corresponding to one or more of quantity information of an RB, quantity information of an RM code, quantity information of an OCC, coding format information, modulation format information, or value information of an SF of the PUCCH

140 — Receive a coefficient that is sent by a base station and that is configured for the parameter information

121 — Calculate, according to the parameter information for which the coefficient is configured, an increment in a formula for calculating transmit power of the PUCCH, and calculate the transmit power of the PUCCH according to a first parameter and the increment

122 — Alternatively, use, as a coefficient of a first parameter, the parameter information for which the coefficient is configured, and calculate transmit power of the PUCCH according to the first parameter and the parameter information for which the coefficient is configured

123 — Alternatively, calculate, according to at least one of the parameter information for which the coefficient is configured, an increment in a formula for calculating transmit power of the PUCCH, use, as a coefficient of a first parameter, at least one of the parameter information for which the coefficient is configured, and calculate the transmit power of the PUCCH according to the first parameter, the increment, and the parameter information for which the coefficient is configured, where the first parameter includes at least one of the following parameters: channel open-loop power, a path loss, a power control dynamic deviation, and a compensation

130 — Transmit the PUCCH according to the calculated transmit power of the PUCCH

Determine parameter information of a physical uplink control channel PUCCH, where the parameter information includes one or more of quantity information of a resource block RB, quantity information of a Reed-Muller RM code, quantity information of an orthogonal cover code OCC, coding format information, modulation format information, or value information of a scale factor SF of the PUCCH, or the parameter information includes at least one configuration parameter corresponding to one or more of quantity information of an RB, quantity information of an RM code, quantity information of an OCC, coding format information, modulation format information, or value information of an SF of the PUCCH  410

Send the parameter information to a terminal, so that the terminal calculates transmit power of the PUCCH according to the parameter information  420

FIG. 4

POWER CONTROL METHOD, TERMINAL, AND BASE STATION

CROSS-REFERENCE TO RELATED APPLICATIONS

This application is a continuation of International Application No. PCT/CN2015/078839, filed on May 13, 2015, the disclosure of which is hereby incorporated by reference in its entirety.

TECHNICAL FIELD

Embodiments of the present invention relate to the field of communications technologies, and in particular, to a power control method, a terminal, and a base station.

BACKGROUND

A Long Term Evolution Advanced (LTE-A) system of the 3rd Generation Partnership Project (3GPP) has a higher bandwidth requirement, so as to support an uplink data rate and a downlink data rate. To meet a requirement of LTE-A, the LTE-A system uses a carrier aggregation (CA) technology as a method for extending bandwidth of the LTE-A system, and uses a multiple-antenna enhancement (Multiple-Input Multiple-Output, MIMO) technology and a coordinated multi-point (CoMP) technology to increase a data rate and improve system performance.

In LTE-A, either of a physical uplink control channel (PUCCH) and a physical uplink shared channel (PUSCH) has an explicit power control formula, but power control of a sounding reference signal (SRS) is adding an offset to transmit power of the PUSCH. A formula for power control calculation of the PUCCH is:

$$P_{PUCCH}(i) = \min\left\{ \begin{array}{l} P_{CMAX,c}(i), \\ P_{0\_PUCCH} + PL_c + h(n_{CQI}, n_{HARQ}, n_{SR}) + \\ \Delta_{F\_PUCCH}(F) + \Delta_{TxD}(F') + g(i) \end{array} \right\},$$

where $P_{PUCCH}(i)$ represents transmit power of the PUCCH channel in a subframe $P_{CMAX,c}$ represents maximum transmit power of UE on a carrier c, and $P_{0\_PUCCH}$ represents channel open-loop power of the PUCCH. $PL_c$ represents a path loss on the carrier c, $\Delta_{F\_PUCCH}(F)$ represents a compensation for different PUCCH formats, $h(n_{CQI}, n_{HARQ}, n_{SR})$ is a compensation for a quantity of bits of different uplink control information (Uplink Control Information, UCI) in a same PUCCH format, and $g(i)$ represents a power control dynamic deviation, where $$g(i) = g(i-1) + \sum_{m=0}^{M-1} \delta_{PUCCH}(i - k_m).$$

Compared with an $(i-1)^{th}$ uplink subframe, an $i^{th}$ uplink subframe has a TPC accumulation, and $\delta_{PUCCH}$ is a closed-loop modification coefficient indicated by a TPC power control command in downlink scheduling signaling in a DCI format 1/1A/1B/1D/2/2A/2B or a DCI format 3/3A. $\Delta_{TxD}(F')$ is a parameter related to multiple antenna ports, and when the PUCCH occupies only one antenna port, $\Delta_{TxD}(F')=0$.

$h(n_{CQI}, n_{HARQ}, n_{SR})$ is a compensation for a quantity of bits of different UCI on the PUCCH, where $n_{CQI}$ is a quantity of bits of a channel quality indicator (CQI), $n_{HARQ}$ is a quantity of bits of a hybrid automatic repeat request (HARQ), and $n_{SR}$ is a quantity of bits of a scheduling request SR.

When the PUCCH format is 1, 1a, or 1b, $h(n_{CQI}, n_{HARQ}, n_{SR})=0$.

When the PUCCH format is 2, 2a, or 2b, and is a normal cyclic prefix (normal cyclic prefix, NCP), $$h(n_{CQI}, n_{HARQ}, n_{SR}) = \begin{cases} 10\log_{10}\left(\frac{n_{CQI}}{4}\right) & \text{if } n_{CQI} \geq 4 \\ 0 & \text{otherwise} \end{cases}.$$

When the PUCCH format is 2, and is an extended cyclic prefix (extended cyclic prefix, ECP), $$h(n_{CQI}, n_{HARQ}, n_{SR}) = \begin{cases} 10\log_{10}\left(\frac{n_{CQI} + n_{HARQ}}{4}\right) & \text{if } n_{CQI} + n_{HARQ} \geq 4 \\ 0 & \text{otherwise} \end{cases}.$$

When the PUCCH format is 3, and a quantity of bits is greater than 11, $$h(n_{CQI}, n_{HARQ}, n_{SR}) = \frac{n_{HARQ} + n_{SR} - 1}{3}.$$

When the PUCCH format is 3, and a quantity of bits is less than or equal to 11, $$h(n_{CQI}, n_{HARQ}, n_{SR}) = \frac{n_{HARQ} + n_{SR} - 1}{2}.$$

To further increase a peak data rate and a system throughput, massive carrier aggregation Massive CA is used to support aggregation of a maximum of 32 carriers, so that a maximum quantity of uplink aggregated carriers or downlink aggregated carriers may reach 32. Because the maximum quantity of downlink aggregated carriers may reach 32, uplink control information (UCI) that needs to be fed back on an uplink channel exponentially increases, overheads are relatively large, and a capacity shortage problem occurs on an existing PUCCH. However, when UCI that supports a maximum of 32 carriers is fed back on a PUCCH, an existing power control mechanism cannot perform power control on the PUCCH.

SUMMARY

Embodiments of the present invention provide a power control method, a terminal, and a base station, so that transmit power of a PUCCH is calculated according to obtained parameter information of the PUCCH, so as to resolve a power control problem of the PUCCH that occurs when UCI that supports a maximum of 32 carriers is fed back on the PUCCH.

According to a first aspect, an embodiment of the present invention provides a transmit power control method, where the method includes: obtaining parameter information of a physical uplink control channel (PUCCH), where the parameter information includes one or more of quantity information of a resource block (RB), quantity information of a Reed-Muller (RM) code, quantity information of an orthogonal cover code (OCC), coding format information, modulation format information, and value information of a scale factor (SF) of the PUCCH, or the parameter information includes at least one configuration parameter corresponding to one or more of quantity information of an RB, quantity information of an RM code, quantity information of an OCC, coding format information, modulation format information, and value information of an SF of the PUCCH; calculating transmit power of the PUCCH according to the parameter information; and transmitting the PUCCH according to the calculated transmit power of the PUCCH.

With reference to the first aspect, in a first possible implementation of the first aspect, the calculating transmit power of the PUCCH according to the parameter information includes: calculating a transmit power increment of the PUCCH according to the parameter information, and calculating the transmit power of the PUCCH according to a first parameter and the increment; or using the parameter information as a coefficient of a first parameter, and calculating the transmit power of the PUCCH according to the first parameter and the parameter information; or calculating a transmit power increment of the PUCCH according to at least one of the parameter information, using the at least one of the parameter information as a coefficient of a first parameter, and calculating the transmit power of the PUCCH according to the first parameter and the parameter information, where the first parameter includes at least one of the following parameters: channel open-loop power, a path loss, a power control dynamic deviation, and a compensation.

With reference to the first aspect, in a second possible implementation of the first aspect, before the calculating transmit power of the PUCCH according to the parameter information, the method further includes: receiving a coefficient that is sent by a base station and that is configured for the parameter information; and the calculating transmit power of the PUCCH according to the parameter information includes: calculating a transmit power increment of the PUCCH according to the parameter information for which the coefficient is configured, and calculating the transmit power of the PUCCH according to a first parameter and the increment; or using, as a coefficient of a first parameter, the parameter information for which the coefficient is configured, and calculating the transmit power of the PUCCH according to the first parameter and the parameter information for which the coefficient is configured; or calculating a transmit power increment of the PUCCH according to at least one of the parameter information for which the coefficient is configured, using, as a coefficient of a first parameter, at least one of the parameter information for which the coefficient is configured, and calculating the transmit power of the PUCCH according to the first parameter, the increment, and the parameter information for which the coefficient is configured, where the first parameter includes at least one of the following parameters: channel open-loop power, a path loss, a power control dynamic deviation, and a compensation.

With reference to the first or the second possible implementation of the first aspect, in a third possible implementation of the first aspect, the increment and/or the coefficient of the first parameter is a linear function, a logarithmic function, or an exponential function of the parameter information.

With reference to any one of the foregoing possible implementations, in a fourth possible implementation of the first aspect, the obtaining parameter information of a physical uplink control channel PUCCH includes: receiving a configuration parameter sent by the base station; and obtaining the parameter information according to a correspondence between the configuration parameter and the parameter information.

With reference to the fourth possible implementation of the first aspect, in a fifth possible implementation of the first aspect, the correspondence is preconfigured by a terminal, or is obtained from configuration information sent by the base station.

With reference to the first aspect, in a sixth possible implementation of the first aspect, the parameter information is the at least one configuration parameter, and the obtaining parameter information of a physical uplink control channel (PUCCH) includes: receiving at least one configuration parameter sent by a base station, where each configuration parameter in the at least one configuration parameter is in a one-to-one correspondence with at least one of the quantity information of the RB, the quantity information of the RM code, the quantity information of the OCC, the coding format information, the modulation format information, or the value information of the SF included in the parameter information.

With reference to the sixth possible implementation of the first aspect, in a seventh possible implementation of the first aspect, the calculating transmit power of the PUCCH according to the parameter information includes: calculating a transmit power increment of the PUCCH according to the at least one configuration parameter, and calculating the transmit power of the PUCCH according to a first parameter and the increment; or using the at least one configuration parameter as a coefficient of a first parameter, and calculating the transmit power of the PUCCH according to the first parameter and the at least one configuration parameter; or calculating a transmit power increment of the PUCCH according to at least one of the at least one configuration parameter, using the at least one of the at least one configuration parameter as a coefficient of a first parameter, and calculating the transmit power of the PUCCH according to the first parameter and the at least one configuration parameter, where the first parameter includes at least one of the following parameters: channel open-loop power, a path loss, a power control dynamic deviation, and a compensation.

With reference to the seventh possible implementation of the first aspect, in an eighth possible implementation of the first aspect, the increment and/or the coefficient of the first parameter is a linear function, a logarithmic function, or an exponential function of the at least one configuration parameter.

According to a second aspect, an embodiment of the present invention provides a transmit power control method, where the method includes: determining parameter information of a physical uplink control channel (PUCCH), where the parameter information includes one or more of quantity information of a resource block (RB), quantity information of a Reed-Muller (RM) code, quantity information of an orthogonal cover code (OCC), coding format information, modulation format information, and value information of a scale factor (SF) of the PUCCH, or the parameter information includes at least one configuration parameter corresponding to one or more of quantity information of an RB, quantity information of an RM code, quantity information of an OCC, coding format information, modulation format information, and value information of an SF of the PUCCH;

and sending the parameter information to a terminal, so that the terminal calculates transmit power of the PUCCH according to the parameter information.

With reference to the second aspect, in a first possible implementation of the second aspect, before the sending the parameter information to a terminal, the method further includes: configuring a coefficient for the parameter information; and the sending the parameter information to a terminal includes: sending, to the terminal, the parameter information for which the coefficient is configured, so that the terminal calculates the transmit power of the PUCCH according to the parameter information for which the coefficient is configured.

With reference to the second aspect, in a second possible implementation of the second aspect, the parameter information is the at least one configuration parameter, and the determining parameter information of a physical uplink control channel PUCCH includes: determining at least one configuration parameter according to a correspondence between the at least one configuration parameter and the parameter information.

With reference to the second possible implementation of the second aspect, in a third possible implementation of the second aspect, the correspondence is preconfigured by a base station, or is obtained from configuration information sent by the terminal.

According to a third aspect, an embodiment of the present invention provides a terminal, where the terminal includes: an obtaining module, configured to obtain parameter information of a physical uplink control channel (PUCCH), where the parameter information includes one or more of quantity information of a resource block (RB), quantity information of a Reed-Muller (RM) code, quantity information of an orthogonal cover code (OCC), coding format information, modulation format information, and value information of a scale factor (SF) of the PUCCH, or the parameter information includes at least one configuration parameter corresponding to one or more of quantity information of an RB, quantity information of an RM code, quantity information of an OCC, coding format information, modulation format information, and value information of an SF of the PUCCH; a calculation module, configured to calculate transmit power of the PUCCH according to the parameter information obtained by the obtaining module; and a transmit module, configured to transmit the PUCCH according to the transmit power that is of the PUCCH and that is calculated by the calculation module.

With reference to the third aspect, in a first possible implementation of the third aspect, the calculation module is specifically configured to: calculate a transmit power increment of the PUCCH according to the parameter information, and calculate the transmit power of the PUCCH according to a first parameter and the increment; or use the parameter information as a coefficient of a first parameter, and calculate the transmit power of the PUCCH according to the first parameter and the parameter information; or calculate a transmit power increment of the PUCCH according to at least one of the parameter information, use the at least one of the parameter information as a coefficient of a first parameter, and calculate the transmit power of the PUCCH according to the first parameter, the increment, and the parameter information for which the coefficient is configured, where the first parameter includes at least one of the following parameters: channel open-loop power, a path loss, a power control dynamic deviation, and a compensation.

With reference to the third aspect, in a second possible implementation of the third aspect, the terminal further includes: a receiving module, configured to receive a coefficient that is sent by a base station and that is configured for the parameter information; and the calculation module is specifically configured to: calculate a transmit power increment of the PUCCH according to the parameter information for which the coefficient is configured, and calculate the transmit power of the PUCCH according to a first parameter and the increment; or use, as a coefficient of a first parameter, the parameter information for which the coefficient is configured, and calculate the transmit power of the PUCCH according to the first parameter and the parameter information for which the coefficient is configured; or calculate a transmit power increment of the PUCCH according to at least one of the parameter information for which the coefficient is configured, use, as a coefficient of a first parameter, at least one of the parameter information for which the coefficient is configured, and calculate the transmit power of the PUCCH according to the first parameter, the increment, and the parameter information for which the coefficient is configured, where the first parameter includes at least one of the following parameters: channel open-loop power, a path loss, a power control dynamic deviation, and a compensation.

With reference to the first or the second possible implementation of the third aspect, in a third possible implementation of the third aspect, the increment and/or the coefficient of the first parameter is a linear function, a logarithmic function, or an exponential function of the parameter information.

With reference to any one of the foregoing possible implementations, in a fourth possible implementation of the third aspect, the obtaining module is specifically configured to: receive a configuration parameter sent by the base station, and obtain the parameter information according to a correspondence between the configuration parameter and the parameter information.

With reference to the fourth possible implementation of the third aspect, in a fifth possible implementation of the third aspect, the correspondence is preconfigured by the terminal, or is obtained from configuration information sent by the base station.

With reference to the third aspect, in a sixth possible implementation of the third aspect, the parameter information is the at least one configuration parameter, and the obtaining module is specifically configured to: receive at least one configuration parameter sent by a base station, where each configuration parameter in the at least one configuration parameter is in a one-to-one correspondence with at least one of the quantity information of the RB, the quantity information of the RM code, the quantity information of the OCC, the coding format information, the modulation format information, or the value information of the SF included in the parameter information.

With reference to the sixth possible implementation of the third aspect, in a seventh possible implementation of the third aspect, the calculation module is specifically configured to: calculate a transmit power increment of the PUCCH according to the at least one configuration parameter, and calculate the transmit power of the PUCCH according to a first parameter and the increment; or use the at least one configuration parameter as a coefficient of a first parameter, and calculate the transmit power of the PUCCH according to the first parameter and the at least one configuration parameter; or calculate a transmit power increment of the PUCCH according to at least one of the at least one configuration parameter, use the at least one of the at least one configuration parameter as a coefficient of a first parameter, and calculate the transmit power of the PUCCH according to the first parameter and the at least one configuration parameter, where the first parameter includes at least one of the following parameters: channel open-loop power, a path loss, a power control dynamic deviation, and a compensation.

With reference to the seventh possible implementation of the third aspect, in an eighth possible implementation of the third aspect, the increment and/or the coefficient of the first parameter is a linear function, a logarithmic function, or an exponential function of the at least one configuration parameter.

According to a fourth aspect, an embodiment of the present invention provides a base station, where the base station includes:

a determining module, configured to determine parameter information of a physical uplink control channel (PUCCH), where the parameter information includes one or more of quantity information of a resource block (RB), quantity information of a Reed-Muller (RM) code, quantity information of an orthogonal cover code (OCC), coding format information, modulation format information, and value information of a scale factor (SF) of the PUCCH, or the parameter information includes at least one configuration parameter corresponding to one or more of quantity information of an RB, quantity information of an RM code, quantity information of an OCC, coding format information, modulation format information, and value information of an SF of the PUCCH; and a sending module, configured to send the parameter information determined by the determining module to a terminal, so that the terminal calculates transmit power of the PUCCH according to the parameter information.

With reference to the fourth aspect, in a first possible implementation of the fourth aspect, the base station further includes: a configuration module, configured to configure a coefficient for the parameter information; and the sending module is specifically configured to send, to the terminal, the parameter information for which the coefficient is configured, so that the terminal calculates the transmit power of the PUCCH according to the parameter information for which the coefficient is configured.

With reference to the fourth aspect, in a second possible implementation of the fourth aspect, the parameter information is the at least one configuration parameter, and the determining module is specifically configured to: determine at least one configuration parameter according to a correspondence between the at least one configuration parameter and the parameter information.

With reference to the second possible implementation of the fourth aspect, in a third possible implementation of the fourth aspect, the correspondence is preconfigured by the base station, or is obtained from configuration information sent by the terminal.

Based on the foregoing technical solutions, according to the power control method, the terminal, and the base station provided in the embodiments of the present invention, parameter information of a PUCCH is obtained, and transmit power of the PUCCH is calculated according to the parameter information, so as to resolve a power control problem of the PUCCH that occurs when UCI that supports a maximum of 32 carriers is fed back on the PUCCH.

BRIEF DESCRIPTION OF DRAWINGS

To describe the technical solutions in the embodiments of the present invention more clearly, the following briefly describes the accompanying drawings required for describing the embodiments of the present invention. Apparently, the accompanying drawings in the following description show merely some embodiments of the present invention, and a person of ordinary skill in the art may still derive other drawings from these accompanying drawings without creative efforts.

FIG. 1 is a schematic flowchart of a power control method according to an embodiment of the present invention;

FIG. 2 is a schematic flowchart of a power control method according to another embodiment of the present invention;

FIG. 4 is a schematic flowchart of a power control method according to another embodiment of the present invention;

DESCRIPTION OF EMBODIMENTS

Figure 3:
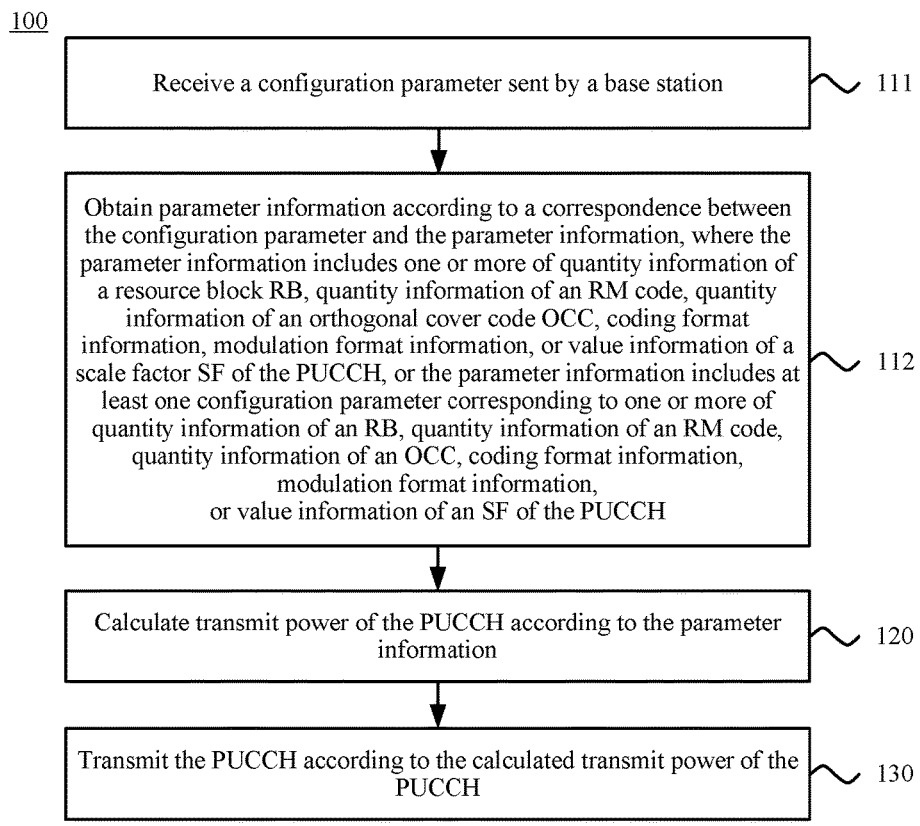
FIG. 3 is a schematic flowchart of a power control method according to another embodiment of the present invention.

The following clearly describes the technical solutions in the embodiments of the present invention with reference to the accompanying drawings in the embodiments of the present invention. Apparently, the described embodiments are a part rather than all of the embodiments of the present invention. All other embodiments obtained by a person of ordinary skill in the art based on the embodiments of the present invention without creative efforts shall fall within the protection scope of the present invention.

It should be understood that, in the embodiments of the present invention, new PUCCH formats may include the following cases:

1. In a frequency domain, multiple resource blocks (RB) may be used to transmit one PUCCH.

2. In a code domain, multiple Reed-Muller (RM) codes may be used to transmit one PUCCH.

3. In a time domain, multiple symbols in the time domain may be divided into multiple groups, each group uses an orthogonal cover code (OCC) of a shorter length, and each group of symbols is used to transmit one PUCCH.

4. Different scale factors (SF) are used.

5. Different coding formats are used for different PUCCH formats or different quantities of PUCCH bits. For example, in addition to an RM code currently applied to a PUCCH, use of a turbo code (TC) currently applied to a PDCCH or a tail biting convolutional code (TBCC) currently applied to a PUSCH is further considered, and different coding formats may be corresponding to different coding factors (CF).

6. Different modulation schemes are used for different PUCCH formats or different quantities of PUCCH bits. For example, in addition to binary phase shift keying (BPSK) currently applied to a PUCCH format 1a and quadrature phase shift keying (QPSK) currently applied to a PUCCH format 1b/2/2a/2b/3, use of 16 quadrature amplitude modulation (QAM) or higher order modulation is further considered, and different modulation schemes may be corresponding to different modulation factors (MF).

It should be further understood that in the embodiments of the present invention, a terminal may also be referred to as a system, a subscriber unit, a subscriber station, a mobile station, a remote station, a remote terminal, a mobile device, a user terminal, a terminal, a wireless communications device, user agent, a user apparatus, or user equipment (UE). The terminal may be a cellular phone, a cordless phone, a Session Initiation Protocol (SIP) phone, a Wireless Local Loop (WLL) station, a Personal Digital Assistant (PDA), a handheld device having a wireless communication function, an in-vehicle device, a computing device, or another processing device connected to a wireless modem.

It should be further understood that the base station in the embodiments of the present invention can be used to communicate with a mobile device; and the base station may be an Access Point (AP) of Wi-Fi, or a Base Transceiver Station (BTS) in Global System for Mobile Communications (GSM) or Code Division Multiple Access (CDMA); or may be an NodeB (NB) in Wideband Code Division Multiple Access (WCDMA); or may be an Evolved Node B (eNB or eNodeB) in Long Term Evolution (LTE), a relay station or an access point, a base station device in a future 5G network, or the like.

FIG. 1 is a schematic flowchart of a power control method 100 according to an embodiment of the present invention. The method 100 shown in FIG. 1 may be executed by a terminal, and the method 100 includes the following steps:

110. Obtain parameter information of a physical uplink control channel PUCCH, where the parameter information includes one or more of quantity information of a resource block RB, quantity information of an RM code, quantity information of an orthogonal cover code OCC, coding format information, modulation format information, or value information of a scale factor SF of the PUCCH, or the parameter information includes at least one configuration parameter corresponding to one or more of quantity information of an RB, quantity information of an RM code, quantity information of an OCC, coding format information, modulation format information, or value information of an SF of the PUCCH.

120. Calculate transmit power of the PUCCH according to the parameter information.

130. Transmit the PUCCH according to the calculated transmit power of the PUCCH.

Specifically, in this embodiment of the present invention, the transmit power of the PUCCH may be calculated according to the obtained parameter information of the PUCCH, and the PUCCH is transmitted according to the transmit power. The parameter information may include one or more of the quantity information of the resource block RB, the quantity information of the RM code, the quantity information of the orthogonal cover code OCC, the coding format information, the modulation format information, or the value information of the scale factor SF of the PUCCH. That is, the parameter information may be any one of the foregoing six types of information, or may be a combination of any multiple types of information in the foregoing six types of information. When the parameter information includes the coding format information, a first value may be determined according to a correspondence between the coding format information and the first value, to calculate the transmit power of the PUCCH. When the parameter information includes the modulation format information, a second value may be determined according to a correspondence between the modulation format information and the second value, to calculate the transmit power of the PUCCH. Alternatively, the parameter information includes the at least one configuration parameter corresponding to one or more of the quantity information of the RB, the quantity information of the RM code, the quantity information of the OCC, the coding format information, the modulation format information, or the value information of the SF of the PUCCH. That is, the parameter information may be any one of the foregoing six types of information, or may be a combination of any multiple types of information in the foregoing six types of information, and there may be one or more configuration parameters corresponding to the parameter information.

Therefore, in the power control method provided in this embodiment of the present invention, parameter information of a PUCCH is obtained, and transmit power of the PUCCH is calculated according to the parameter information, so as to resolve a power control problem of the PUCCH that occurs when UCI that supports a maximum of 32 carriers is fed back on the PUCCH.

It should be understood that, in this embodiment of the present invention, the correspondence between the coding format information and the first value and/or the correspondence between the modulation format information and the second value may be preconfigured by the terminal, or may be obtained from configuration information sent by a base station, and this is not limited in this embodiment of the present invention. For example, the correspondence between the coding format information and the first value, and the correspondence between the modulation format information and the second value may be shown in the following Table 1:

| Coding format CF information | First value | Modulation format MF information | Second value |
|---|---|---|---|
| CF = TC | 1 | MF = BPSK | 1 |
| CF = RM | 3 | MF = QPSK | 0 |
| CF = TBCC | 0.8 | MF = 16 QAM | 5 |

It should be further understood that, in this embodiment of the present invention, when the parameter information of the PUCCH is the quantity information of the RB, the quantity information of the RM code, the quantity information of the OCC, the coding format information, the modulation format information, or the value information of the SF, a received configuration parameter sent by the base station is a parameter corresponding to the parameter information. As shown in the following Table 2, each type of information in the foregoing six types of information is corresponding to one parameter.

| $N_{RB\_PUCCH}$ | $N_{RM}$ | $N_{OCC}$ | CF | MF | SF |
|---|---|---|---|---|---|
| α | β | γ | δ | ε | ω |

As shown in the following Table 3, different values of a same parameter are corresponding to different physical quantities of a same type of information.

| | | | |
|---|---|---|---|
| α = 1 | $N_{RB\_PUCCH}$ = 10 | δ = 1 | CF = TC |
| α = 2 | $N_{RB\_PUCCH}$ = 1 | δ = 0.5 | CF = RM |
| α = 3 | $N_{RB\_PUCCH}$ = 5 | δ = 0.2 | CF = TBCC |
| β = 1 | $N_{RM}$ = 1 | ε = −1 | MF = BPSK |
| β = 2 | $N_{RM}$ = 2 | ε = 1 | MF = QPSK |
| β = 3 | $N_{RM}$ = 3 | ε = 0 | MF = 16 QAM |
| γ = 1 | $N_{OCC}$ = 5 | ω = −1 | SF = 6 |
| γ = 0.5 | $N_{OCC}$ = 3 | ω = 1 | SF = 4 |
| γ = 1.5 | $N_{OCC}$ = 1 | ω = 4 | SF = 3 |

For example, when determining that the parameter information of the PUCCH is the quantity information of the RB and $N_{RB\_PUCCH}$=10 according to the foregoing Table 3, the base station configures a parameter α=1, and sends the configuration parameter to the terminal, so that the terminal calculates the transmit power of the PUCCH according to the configuration parameter. When determining that the parameter information of the PUCCH is the quantity information of the RB, the quantity information of the RM code, and the quantity information of the OCC, and determining that $N_{RB\_PUCCH}$=10, $N_{RM}$=2, and $N_{OCC}$=1 according to the foregoing Table 3, the base station configures a parameter α=1, a parameter β=1, and a parameter γ=1.5, and sends the configuration parameters to the terminal, so that the terminal calculates the transmit power of the PUCCH according to the configuration parameters.

Optionally, in an embodiment of the present invention, in step 120, a transmit power increment of the PUCCH may be calculated according to the parameter information, and the transmit power of the PUCCH is calculated according to a first parameter and the increment.

It should be understood that, in this embodiment of the present invention, the increment may be a linear function, a logarithmic function, or an exponential function of the parameter information, but this is not limited in this embodiment of the present invention. For example, the increment may alternatively be another function of the parameter information.

It should be noted that, in this embodiment of the present invention, the increment is a parameter that is used when the transmit power of the PUCCH is calculated and that is related to a format and content of the PUCCH and a quantity of antenna ports, other than parameters such as channel open-loop power, a path loss, a power control dynamic deviation, and a compensation. A value of the increment may be a positive number, or may be a negative number, and this needs to be determined according to a practical situation, and is not limited in this embodiment of the present invention.

For example, in this embodiment of the present invention, the parameter information used to calculate the transmit power increment of the PUCCH may be quantity information $N_{RB\_PUCCH}$ of the RB. If $N_{RB\_PUCCH}$=10, and the increment is $10\log_{10}(N_{RB\_PUCCH})$, a formula for calculating the transmit Dower of the PUCCH is:

$$P_{PUCCH}(i) = \min\begin{cases} P_{CMAX,c}(i), \\ 10\log_{10}(N_{RB\_PUCCH}) + P_{0\_PUCCH} + PL_c + \\ h(n_{CQI}, n_{HARQ}, n_{SR}) + \Delta_{F\_PUCCH}(F) + \Delta_{TxD}(F') + g(i) \end{cases} \quad (1)$$

It should be noted that, the formula (1) is used only as an example to describe the technical solution in this embodiment of the present invention, and is not construed as any limitation on this embodiment of the present invention. The increment may alternatively be $$N_{RB\_PUCCH}, N_{RB\_PUCCH} + C, \frac{N_{RB\_PUCCH}}{C}, C^{N_{RB\_PUCCH}}$$

(C is any constant), or the like. In addition, the parameter information may alternatively be the quantity information of the RM code, for example, $N_{RM}$=2; may be the quantity information of the OCC, for example, $N_{OCC}$=1; may be the coding format information, for example, CF=TC which may be corresponding to a first value 1; may be the modulation format information, for example, MF=QPSK, which may be corresponding to a second value 0; or may be the value information of the SF, for example, SF=6. For brevity of description, details are not described herein.

For another example, in this embodiment of the present invention, the parameter information used to calculate the transmit power increment of the PUCCH may be quantity information $N_{RB\_PUCCH}$ of the RB, quantity information $N_{RM}$ of the RM code, and quantity information $N_{OCC}$ of the OCC, and the increment is expressed as $$10\log_{10}(N_{RB\_PUCCH}) + 2^{N_{OCC}} + \frac{N_{RM}}{3}.$$

In this case, a formula for calculating the transmit power of the PUCCH is:

$$P_{PUCCH}(i) = \qquad (2)$$

$$\min\begin{cases} P_{CMAX,c}(i), \\ P_{0\_PUCCH} + PL_c + \\ h(n_{CQI}, n_{HARQ}, n_{SR}) + \Delta_{F\_PUCCH}(F) + \Delta_{TxD}(F') + g(i) \\ 10\log_{10}(N_{RB\_PUCCH}) + 2^{N_{OCC}} + \frac{N_{RM}}{3} \end{cases}$$

It should be noted that, the formula (2) is used only as an example to describe the technical solution in this embodiment of the present invention, and is not construed as any limitation on this embodiment of the present invention. The increment may alternatively be another function of the parameter information. In addition, the parameter information may alternatively be a combination of any multiple types of information in the following six types of information: the quantity information of the RB, for example, $N_{RB\_PUCCH}$=10; the quantity information of the RM code, for example, $N_{RM}$=2; the quantity information of the OCC, for example, $N_{OCC}$=1; the coding format information, for example, CF=TC, which may be corresponding to a first value 1; the modulation format information, for example, MF=QPSK, which may be corresponding to a second value 0; and the value information of the SF, for example, SF=6. For brevity of description, details are not described herein.

It should be understood that, a value of a parameter that emerges in this embodiment of the present invention is used as an example to describe the technical solution in this embodiment of the present invention, and is not construed as any limitation on the present invention. Obviously, values of these parameters need to be determined according to a practical situation, and are not limited in this embodiment of the present invention.

Optionally, in another embodiment of the present invention, in step 120, the parameter information may be used as a coefficient of a first parameter, and the transmit power of the PUCCH is calculated according to the first parameter and the parameter information. The first parameter includes at least one of the following parameters: channel open-loop power, a path loss, a power control dynamic deviation, and a compensation.

It should be understood that, in this embodiment of the present invention, the parameter information may be used as a coefficient of an item that is in a formula for calculating the transmit power of the PUCCH and that is related to the PUCCH. Generally, the parameter information may be used as a coefficient of an item related to a format and content of the PUCCH and a quantity of antenna ports. For example, the parameter information may be used as coefficients of $h(n_{CQI}, n_{HARQ}, n_{SR})$, $\Delta_{F\_PUCCH}(F)$, $\Delta_{TxD}(F')$, in the formula for calculating the transmit power of the PUCCH, but this embodiment of the present invention is not limited thereto.

It should be further understood that, in this embodiment of the present invention, the coefficient of the first parameter may be a linear function, a logarithmic function, or an exponential function of the parameter information, but this is not limited in this embodiment of the present invention. For example, the coefficient of the first parameter may alternatively be another function of the parameter information.

For example, in this embodiment of the present invention, parameter information used to calculate the coefficient of the first parameter may be quantity information $N_{RB\_PUCCH}$ of the RB, and a formula for calculating the transmit power of the PUCCH is:

$$P_{PUCCH}(i) = \min\begin{cases} P_{CMAX,c}(i), \\ P_{0\_PUCCH} + PL_c + \dfrac{h(n_{CQI}, n_{HARQ}, n_{SR})}{N_{RB\_PUCCH}} + \\ \Delta_{F\_PUCCH}(F) + \Delta_{TxD}(F') + g(i) \end{cases} \quad (3)$$

It should be noted that, the formula (3) is used only as an example to describe the technical solution in this embodiment of the present invention, and is not construed as any limitation on this embodiment of the present invention. The coefficient of the first parameter may alternatively be $$N_{RB\_PUCCH}, N_{RB\_PUCCH} + C, \frac{N_{RB\_PUCCH}}{C}, C^{N_{RB\_PUCCH}}$$

(C is any constant), or the like. In addition, the parameter information may alternatively be the quantity information of the RM code, for example, $N_{RM}=2$; may be the quantity information of the OCC, for example, $N_{OCC}=1$; may be the coding format information, for example, CF=TC which may be corresponding to a first value 1; may be the modulation format information, for example, MF=QPSK, which may be corresponding to a second value 0; or may be the value information of the SF, for example, SF=6 For brevity of description, details are not described herein.

It should be further noted that, the parameter information may alternatively be used as/replace a coefficient of another first parameter in the formula for calculating the transmit power of the PUCCH; or the parameter information may be used as coefficients of multiple first parameters, and the coefficients of the first parameters may be a same function or different functions of the parameter information.

For another example, in this embodiment of the present invention, the parameter information used to calculate the coefficient of the first parameter in the formula for calculating the transmit power of the PUCCH may be quantity information $N_{RB\_PUCCH}$ of the RB, quantity information $N_{RM}$ of the RM code, and quantity information $N_{OCC}$ of the OCC. The parameter information is used as coefficients of multiple first parameters, and a power control formula of the PUCCH is:

$$P_{PUCCH}(i) = \min\begin{cases} P_{CMAX,c}(i), \\ P_{0\_PUCCH} + PL_c + \dfrac{h(n_{CQI}, n_{HARQ}, n_{SR})}{N_{RB\_PUCCH}} + \dfrac{N_{RM}}{3} \\ \Delta_{F\_PUCCH}(F) + 2^{N_{OCC}} \Delta_{TxD}(F') + g(i) \end{cases} \quad (4)$$

The parameter information may alternatively be used as a coefficient of one first parameter, for example, $\Delta_{F\_PUCCH}(F)$, and a power control formula of the PUCCH is:

$$P_{PUCCH}(i) = \min \quad (5)$$

$$\begin{cases} P_{CMAX,c}(i), \\ P_{0\_PUCCH} + PL_c + \\ h(n_{CQI}, n_{HARQ}, n_{SR}) + \left[10\log_{10}(N_{RB\_PUCCH}) + 2^{N_{OCC}} + \dfrac{N_{RM}}{3}\right] \\ \Delta_{F\_PUCCH}(F) + \Delta_{TxD}(F') + g(i) \end{cases}$$

It should be noted that, the formula (4) and the formula (5) are used only as examples to describe the technical solution in this embodiment of the present invention, and are not construed as any limitation on this embodiment of the present invention. The coefficient of the first parameter may alternatively be another function of the parameter information. In addition, the parameter information may alternatively be a combination of any multiple types of information in the following six types of information: the quantity information of the RB, for example, $N_{RB\_PUCCH}=10$; the quantity information of the RM code, for example, $N_{RM}=2$; the quantity information of the OCC, for example, $N_{OCC}=1$; the coding format information, for example, CF=TC which may be corresponding to a first value 1; the modulation format information, for example, MF=QPSK, which may be corresponding to a second value 0; and the value information of the SF, for example, SF=6. For brevity of description, details are not described herein.

It should be further noted that, the foregoing parameter information may further replace the coefficient of the first parameter in the formula for calculating the transmit power of the PUCCH. For example, the parameter information may replace a coefficient of a first parameter $h(n_{CQI}, n_{HARQ}, n_{SR})$ in the formula for calculating the transmit power of the PUCCH, but this embodiment of the present invention is not limited thereto.

For example, in this embodiment of the present invention, the parameter information that replaces the coefficient of the first parameter $h(n_{CQI}, n_{HARQ}, n_{SR})$ in the formula for calculating the transmit power of the PUCCH may be quantity information $N_{RM}$ of the RM code, and a formula of $h(n_{CQI}, n_{HARQ}, n_{SR})$ in the formula for calculating the transmit power of the PUCCH is as follows:

When a quantity of PUCCH bits is greater than 22, $$h(n_{CQI}, n_{HARQ}, n_{SR}) = \frac{n_{CQI} + n_{HARQ} + n_{SR} - 1}{N_{RM} + 1};$$

when a quantity of PUCCH bits is greater than 11, and is less than or equal to 22, $$h(n_{CQI}, n_{HARQ}, n_{SR}) = \frac{n_{CQI} + n_{HARQ} + n_{SR} - 1}{3};$$

or
when a quantity of PUCCH bits is less than or equal to 11, $$h(n_{CQI}, n_{HARQ}, n_{SR}) = \frac{n_{CQI} + n_{HARQ} + n_{SR} - 1}{2}.$$

It should be understood that, a value of a parameter that emerges in this embodiment of the present invention is used as an example to describe the technical solution in this embodiment of the present invention, and is not construed as any limitation on the present invention. Obviously, values of these parameters need to be determined according to a practical situation, and are not limited in this embodiment of the present invention.

Optionally, in another embodiment of the present invention, in step 120, a transmit power increment of the PUCCH may be calculated according to at least one of the parameter information, at least one of the parameter information is used as a coefficient of a first parameter, and the transmit power of the PUCCH is calculated according to the first parameter and the parameter information. The first parameter includes at least one of the following parameters: channel open-loop power, a path loss, a power control dynamic deviation, and a compensation.

It should be understood that, in this embodiment of the present invention, the increment and the coefficient of the first parameter may be linear functions, logarithmic functions, or exponential functions of the parameter information, but this is not limited in this embodiment of the present invention. For example, the increment and the coefficient of the first parameter may alternatively be other functions of the parameter information.

It should be further understood that, in this embodiment of the present invention, the at least one piece of parameter information used to calculate the transmit power increment of the PUCCH may be recorded as first parameter information, the at least one piece of parameter information used as the coefficient of the first parameter may be recorded as second parameter information, and the first parameter information and the second parameter information are same or different parameter information. That is, when the first parameter information and the second parameter information are same parameter information, forms of functions that are respectively used as the increment and the coefficient of the first parameter may be the same or different, and this is not limited in this embodiment of the present invention. Alternatively, when the first parameter information and the second parameter information are different parameter information, forms of functions that are respectively used as the increment and the coefficient of the first parameter may be the same or different, and this is not limited in this embodiment of the present invention.

For example, in this embodiment of the present invention, the first parameter information used to calculate the increment in the formula for calculating the transmit power of the PUCCH and the second parameter information used as the coefficient of the first parameter may be quantity information $N_{RB\_PUCCH}$ of the RB, the increment is expressed as $10\log_{10}(N_{RB\_PUCCH})$, and the coefficient of the first parameter is expressed as $$\frac{1}{N_{RB\_PUCCH}}.$$

In this case, the formula for calculating the transmit power of the PUCCH is:

$$P_{PUCCH}(i) = \min \left\{ \begin{array}{l} P_{CMAX,c}(i), \\ 10\log_{10}(N_{RB\_PUCCH}) + P_{0\_PUCCH} + PL_c + \\ \dfrac{h(n_{CQI}, n_{HARQ}, n_{SR})}{N_{RB\_PUCCH}} + \\ \Delta_{F\_PUCCH}(F) + \Delta_{TxD}(F') + g(i) \end{array} \right\} \quad (6)$$

It should be noted that, the formula (6) is used only as an example to describe the technical solution in this embodiment of the present invention, and is not construed as any limitation on this embodiment of the present invention. The increment and/or the coefficient of the first parameter may alternatively be another function of the parameter information. In addition, the first parameter information and/or the second parameter information may alternatively be a combination of any one or more types of information in the following six types of information: the quantity information of the RB, for example, $N_{RB\_PUCCH}=10$; the quantity information of the RM code, for example, $N_{RM}=2$; the quantity information of the OCC, for example, $N_{OCC}=1$; the coding format information, for example, CF=TC, which may be corresponding to a first value 1; the modulation format information, for example, MF=QPSK, which may be corresponding to a second value 0; and the value information of the SF, for example, SF=6. For brevity of description, details are not described herein.

It should be understood that, a value of a parameter that emerges in this embodiment of the present invention is used as an example to describe the technical solution in this embodiment of the present invention, and is not construed as any limitation on the present invention. Obviously, values of these parameters need to be determined according to a practical situation, and are not limited in this embodiment of the present invention.

Optionally, in another embodiment of the present invention, as shown in FIG. 2, before step 120, the method 100 further includes the following step:

140. Receive a coefficient that is sent by a base station and that is configured for the parameter information.

Step 120 includes one of the following steps:

121. Calculate a transmit power increment of the PUCCH according to the parameter information for which the coefficient is configured, and calculate the transmit power of the PUCCH according to a first parameter and the increment.

122. Use, as a coefficient of a first parameter, the parameter information for which the coefficient is configured, and calculate the transmit power of the PUCCH according to the first parameter and the parameter information for which the coefficient is configured.

123. Calculate a transmit power increment of the PUCCH according to at least one of the parameter information for which the coefficient is configured, use, as a coefficient of a first parameter, at least one of the parameter information for which the coefficient is configured, and calculate the transmit power of the PUCCH according to the first parameter, the increment, and the parameter information for which the coefficient is configured, where the first parameter includes at least one of the following parameters: channel open-loop power, a path loss, a power control dynamic deviation, and a compensation.

Specifically, in this embodiment of the present invention, the parameter information of the PUCCH may be obtained, the coefficient that is sent by the base station and that is configured for the parameter information may be received, and the parameter information for which the coefficient is configured may be used to calculate the transmit power increment of the PUCCH and/or the coefficient of the first parameter, so as to calculate the transmit power of the PUCCH.

Therefore, in the power control method provided in this embodiment of the present invention, parameter information of a PUCCH is obtained, a coefficient configured by a base station for the parameter information is received, and transmit power of the PUCCH is then calculated according to the parameter information for which the coefficient is configured, so as to resolve a power control problem of the PUCCH that occurs when UCI that supports a maximum of 32 carriers is fed back on the PUCCH. In addition, an adjustment range of the transmit power of the PUCCH can be better controlled, so that the power is more precisely and steadily controlled.

It should be understood that, in this embodiment of the present invention, the base station may correspondingly configure a coefficient for each type of information included in the parameter information. For example, the base station may correspondingly configure coefficients α, β, γ, δ, ε, and ω respectively for the quantity information of the RB, the quantity information of the RM code, the quantity information of the OCC, the coding format information, the modulation format information, and the value information of the SF that are included in the parameter information, but this is not limited in this embodiment of the present invention.

It should be further understood that, in this embodiment of the present invention, the increment and/or the coefficient of the first parameter may be a linear function, a logarithmic function, or an exponential function of the parameter information, but this is not limited in this embodiment of the present invention. For example, the increment and/or the coefficient of the first parameter may alternatively be another function.

It should be further understood that, in this embodiment of the present invention, the at least one piece of parameter information used to calculate the transmit power increment of the PUCCH may be recorded as first parameter information, the at least one piece of parameter information used as the coefficient of the first parameter may be recorded as second parameter information, and the first parameter information for which the coefficient is configured and the second parameter information for which the coefficient is configured in step 123 may be same or different parameter information. In addition, the coefficients configured for the first parameter information and the second parameter information may be the same or may be different. That is, when the first parameter information for which the coefficient is configured and the second parameter information for which the coefficient is configured are same parameter information, forms of functions that are respectively used as the increment and the coefficient of the first parameter may be the same or different, and this is not limited in this embodiment of the present invention. Alternatively, when the first parameter information for which the coefficient is configured and the second parameter information for which the coefficient is configured are different parameter information, forms of functions that are respectively used as the increment and the coefficient of the first parameter may be the same or different, and this is not limited in this embodiment of the present invention.

For example, in this embodiment of the present invention, the parameter information used to calculate the increment in the formula for calculating the transmit power of the PUCCH may be quantity information of the RB, and the base station configures a coefficient α for $N_{RB\_PUCCH}$. In this case, the formula for calculating the transmit power of the PUCCH is:

$$P_{PUCCH}(i) = \min \left\{ \begin{array}{l} P_{CMAX,c}(i), \\ \alpha \cdot \log_{\alpha}(N_{RB\_PUCCH}) + P_{0\_PUCCH} + PL_c + \\ h(n_{CQI}, n_{HARQ}, n_{SR}) + \Delta_{F\_PUCCH}(F) + \Delta_{TxD}(F') + g(i) \end{array} \right\} \quad (7)$$

For another example, in this embodiment of the present invention, the parameter information used to calculate the coefficient of the first parameter in the formula for calculating the transmit power of the PUCCH may be quantity information of the RB, and the base station configures a coefficient α for $N_{RB\_PUCCH}$. In this case, the formula for calculating the transmit power of the PUCCH is:

$$P_{PUCCH}(i) = \min \left\{ \begin{array}{l} P_{CMAX,c}(i), \\ P_{0\_PUCCH} + PL_c + \frac{h(n_{CQI}, n_{HARQ}, n_{SR})}{\alpha N_{RB\_PUCCH}} + \\ \Delta_{F\_PUCCH}(F) + \Delta_{TxD}(F') + g(i) \end{array} \right\} \quad (8)$$

It should be noted that, the formula (7) and the formula (8) are used only as examples to describe the technical solution in this embodiment of the present invention, and are not construed as any limitation on this embodiment of the present invention. The increment or the coefficient of the first parameter may alternatively be in another function form. In addition, the parameter information may alternatively be the quantity information of the RM code, with a coefficient β configured by the base station for $N_{RM}$; may be the quantity information of the OCC, with a coefficient γ configured by the base station for $N_{OCC}$; may be the coding format information, with a coefficient δ configured by the base station for the CF; may be the modulation format information, with a coefficient ε configured by the base station for the MF; or may be the value information of the SF, with a coefficient ω configured by the base station for the SF. For brevity of description, details are not described herein.

For another example, in this embodiment of the present invention, the parameter information used to calculate the increment in the formula for calculating the transmit power of the PUCCH may be the quantity information of the RB, the quantity information of the RM code, and the quantity information of the OCC, and the base station correspondingly configures coefficients α, β, and γ respectively for $N_{RB\_PUCCH}$, $N_{RM}$, and $N_{OCC}$. In this case, the formula for calculating the transmit Dower of the PUCCH is:

$$P_{PUCCH}(i) = \min\left\{ \begin{array}{c} P_{CMAX,c}(i), \\ P_{0\_PUCCH} + PL_c + h(n_{CQI}, n_{HARQ}, n_{SR}) + \Delta_{F\_PUCCH}(F) + \\ \Delta_{TxD}(F') + g(i) + \alpha\log_a(N_{RB\_PUCCH}) + \gamma 2^{N_{OCC}} + \beta\frac{N_{RM}}{3} \end{array} \right\} \quad (9)$$

It should be noted that, the formula (9) is used only as an example to describe the technical solution in this embodiment of the present invention, and is not construed as any limitation on this embodiment of the present invention. The increment may alternatively be in another function form. In addition, the parameter information may alternatively be a combination of any multiple types of information in the following six types of information: the quantity information of the RB, the quantity information of the RM code, the quantity information of the OCC, the coding format information, the modulation format information, and the value information of the SF. For brevity of description, details are not described herein.

For another example, in this embodiment of the present invention, the parameter information used to calculate the coefficient of the first parameter in the formula for calculating the transmit power of the PUCCH may be the quantity information of the RB, the quantity information of the RM code, and the quantity information of the OCC, and the base station correspondingly configures coefficients α, β, and γ respectively for $N_{RB\_PUCCH}$, $N_{RM}$, and $N_{OCC}$. The parameter information is used as coefficients of multiple first parameters, and the formula for calculating the transmit power of the PUCCH is:

$$P_{PUCCH}(i) = \min\left\{ \begin{array}{c} P_{CMAX,c}(i), \\ P_{0\_PUCCH} + PL_c + \frac{h(n_{CQI}, n_{HARQ}, n_{SR})}{\alpha N_{RB\_PUCCH}} + \\ \beta\frac{N_{RM}}{3}\Delta_{F\_PUCCH}(F) + \gamma 2^{N_{OCC}}\Delta_{TxD}(F') + g(i) \end{array} \right\} \quad (10)$$

The parameter information may alternatively be used as a coefficient of one first parameter, and the formula for calculating the transmit power of the PUCCH is:

$$P_{PUCCH}(i) = \min\left\{ \begin{array}{c} P_{CMAX,c}(i), \\ P_{0\_PUCCH} + PL_c + h(n_{CQI}, n_{HARQ}, n_{SR}) + \\ \left[\alpha\log a(N_{RB\_PUCCH}) + \lambda 2^{N_{OCC}} + \beta\frac{N_{RM}}{3}\right]\Delta_{F\_PUCCH}(F) + \\ \Delta_{TxD}(F') + g(i) \end{array} \right\} \quad (11)$$

It should be noted that, the formula (10) and the formula (11) are used only as examples to describe the technical solution in this embodiment of the present invention, and are not construed as any limitation on this embodiment of the present invention. The coefficient of the first parameter may alternatively be another function of the parameter information. In addition, the parameter information may alternatively be a combination of any multiple types of information in the following six types of information: the quantity information of the RB, the quantity information of the RM code, the quantity information of the OCC, the coding format information, the modulation format information, and the value information of the SF. For brevity of description, details are not described herein.

For another example, in this embodiment of the present invention, the first parameter information used to calculate the increment in the formula for calculating the transmit power of the PUCCH and the second parameter information used as the coefficient of the first parameter may be the quantity information of the RB, and the base station configures a coefficient α for $N_{RB\_PUCCH}$. In this case, the formula for calculating the transmit power of the PUCCH is:

$$P_{PUCCH}(i) = \min\left\{ \begin{array}{c} P_{CMAX,c}(i), \\ \alpha\log_a(N_{RB\_PUCCH}) + P_{0\_PUCCH} + PL_c + \\ \frac{h(n_{CQI}, n_{HARQ}, n_{SR})}{\alpha N_{RB\_PUCCH}} + \Delta_{F\_PUCCH}(F) + \Delta_{TxD}(F') + g(i) \end{array} \right\} \quad (12)$$

It should be noted that, the formula (12) is used only as an example to describe the technical solution in this embodiment of the present invention, and is not construed as any limitation on this embodiment of the present invention. The increment and the coefficient of the first parameter may alternatively be other functions of the parameter information. In addition, either of the first parameter information and the second parameter information may alternatively be a combination of any one or more types of information in the following six types of information: the quantity information of the RB, the quantity information of the RM code, the quantity information of the OCC, the coding format information, the modulation format information, and the value information of the SF. For brevity of description, details are not described herein.

Optionally, in another embodiment of the present invention, as shown in FIG. 3, step 110 includes the following steps:

111. Receive a configuration parameter sent by a base station.

112. Obtain the parameter information according to a correspondence between the configuration parameter and the parameter information.

Specifically, in this embodiment of the present invention, the configuration parameter sent by the base station may be received, the parameter information is determined according to the correspondence between the configuration parameter and the parameter information, and the parameter information is then used to calculate an increment and/or a coefficient of a first parameter in a formula for calculating transmit power of the PUCCH, so as to calculate the transmit power of the PUCCH. Alternatively, after the parameter information is determined, a coefficient that is sent by the base station and that is configured for the parameter information may be received, and the parameter information for which the coefficient is configured may be used to calculate an increment and/or a coefficient of a first parameter in a formula for calculating transmit power of the PUCCH, so as to calculate the transmit power of the PUCCH.

It should be understood that, in this embodiment of the present invention, the correspondence between the configuration parameter and the parameter information may be preconfigured by a terminal, or may be obtained from configuration information sent by the base station, and this is not limited in this embodiment of the present invention.

It should be further understood that, in this embodiment of the present invention, the base station may correspondingly configure a coefficient for each type of information included in the parameter information. For example, as shown in the following Table 4, the base station may configure coefficients α, β, γ, δ, ε, and ω that are respectively corresponding to the quantity information of the RB, the quantity information of the RM code, the quantity information of the OCC, the coding format information, the modulation format information, and the value information of the SF that are included in the parameter information, but this is not limited in this embodiment of the present invention.

TABLE 4

Table of correspondences between parameter information and configuration parameters

| $N_{RB\_PUCCH}$ = 10 | $N_{RM}$ = 2 | $N_{OCC}$ = 1 | CF = TC | MF = QPSK | SF = 6 |
|---|---|---|---|---|---|
| α = 1 | β = 1 | γ = 1 | δ = 1 | ε = 1 | ω = 1 |

For example, in this embodiment of the present invention, a configuration parameter α=1 sent by the base station is received, the parameter information may be determined as $N_{RB\_PUCCH}$=10 according to a correspondence between the configuration parameter and the parameter information shown in Table 4, and the parameter information is then used to calculate the increment and/or the coefficient of the first parameter in the formula for calculating the transmit power of the PUCCH, so as to calculate the transmit power of the PUCCH. Specifically, the formula for calculating the transmit power of the PUCCH by using the parameter information as the increment and/or the coefficient of the first parameter in the formula for calculating the transmit power of the PUCCH is similar to any one of formula (1) to formula (12). For brevity of description, details are not described herein.

It should be understood that, a value of a parameter that emerges in this embodiment of the present invention is used as an example to describe the technical solution in this embodiment of the present invention, and is not construed as any limitation on the present invention. Obviously, values of these parameters need to be determined according to a practical situation, and are not limited in this embodiment of the present invention.

Optionally, in another embodiment of the present invention, the parameter information is the at least one configuration parameter, the at least one configuration parameter sent by the base station may be received in step 110, and each configuration parameter in the at least one configuration parameter is in a one-to-one correspondence with at least one of the quantity information of the RB, the quantity information of the RM code, the quantity information of the OCC, the coding format information, the modulation format information, or the value information of the SF included in the parameter information. That is, the at least one configuration parameter corresponding to the parameter information is obtained.

Specifically, in this embodiment of the present invention, the one-to-one correspondence between at least one of the foregoing six types of information and the at least one configuration parameter may be shown in the foregoing Table 2 and Table 3.

Optionally, in another embodiment of the present invention, in step 120, the transmit power increment of the PUCCH may be calculated according to the at least one configuration parameter, and the transmit power of the PUCCH is calculated according to the first parameter and the increment.

It should be understood that, in this embodiment of the present invention, the increment may be a linear function, a logarithmic function, or an exponential function of the at least one configuration parameter, but this is not limited in this embodiment of the present invention. For example, the increment may be another function of the at least one configuration parameter.

For example, in this embodiment of the present invention, the at least one configuration parameter used to calculate the increment in the formula for calculating the transmit power of the PUCCH may be a, and the formula for calculating the transmit power of the PUCCH is:

$$P_{PUCCH}(i) = \min\left\{\begin{array}{c} P_{CMAX,c}(i), \\ \alpha + P_{0\_PUCCH} + PL_c + h(n_{CQI}, n_{HARQ}, n_{SR}) + \\ \Delta_{F\_PUCCH}(F) + \Delta_{TxD}(F') + g(i) \end{array}\right\} \quad (13)$$

It should be noted that, the formula (13) is used only as an example to describe the technical solution in this embodiment of the present invention, and is not construed as any limitation on this embodiment of the present invention. The increment may alternatively be $\log_{10} \alpha$, $$\frac{\alpha}{C},$$

$C^\alpha$ (C is any constant), or the like. In addition, the at least one configuration parameter may alternatively be β=1 corresponding to the quantity information of the RM code, for example, $N_{RM}$=2; may be γ=1.5 corresponding to the quantity information of the OCC, for example, $N_{OCC}$=1; may be δ=1 corresponding to the coding format information, for example, CF=TC; may be ε=1 corresponding to the modulation format information, for example, MF=QPSK; or may be ω=−1 corresponding to the value information of the SF, for example, SF=6. For brevity of description, details are not described herein.

For another example, in this embodiment of the present invention, the at least one configuration parameter used to calculate the increment in the formula for calculating the transmit power of the PUCCH may be α, β, and γ, and the formula for calculating the transmit power of the PUCCH is:

$$P_{PUCCH}(i) = \min\left\{\begin{array}{c} P_{CMAX,c}(i), \\ P_{0\_PUCCH} + PL_c + h(n_{CQI}, n_{HARQ}, n_{SR}) + \\ \Delta_{F\_PUCCH}(F) + \Delta_{TxD}(F') + g(i) + 10\log_{10}\alpha + 2^\gamma + \frac{\beta}{3} \end{array}\right\} \quad (14)$$

It should be noted that, the formula (14) is used only as an example to describe the technical solution in this embodiment of the present invention, and is not construed as any limitation on this embodiment of the present invention. The increment may alternatively be another function of the at least one configuration parameter. In addition, the at least one configuration parameter may alternatively be a combination of any multiple configuration parameters in the following six configuration parameters: $\alpha=1$ corresponding to the quantity information of the RB, for example, $N_{RB\_PUCCH}=10$; $\beta=1$ corresponding to the quantity information of the RM code, for example, $N_{RM}=2$; $\gamma=1.5$ corresponding to the quantity information of the OCC, for example, $N_{OCC}=1$; $\delta=1$ corresponding to the coding format information, for example, CF=TC; $\varepsilon=1$ corresponding to the modulation format information, for example, MF=QPSK; and $\omega=-1$ corresponding to the value information of the SF, for example, SF=6. For brevity of description, details are not described herein.

Optionally, in another embodiment of the present invention, in step 120, the at least one configuration parameter may be used as the coefficient of the first parameter, and the transmit power of the PUCCH is calculated according to the first parameter and the at least one configuration parameter.

It should be understood that, in this embodiment of the present invention, the at least one configuration parameter may be used as a coefficient of a first parameter that is in the formula for calculating the transmit power of the PUCCH and that is related to the PUCCH. Generally, the at least one configuration parameter may be used as a coefficient of an item related to a format and content of the PUCCH and a quantity of antenna ports. For example, the at least one configuration parameter may be used as coefficients of $h(n_{CQI}, n_{HARQ}, n_{SR})$ $\Delta_{F\_PUCCH}(F)$, and $\Delta_{TxD}(F')$ in the formula for calculating the transmit power of the PUCCH, but this embodiment of the present invention is not limited thereto.

It should be further understood that, in this embodiment of the present invention, the coefficient of the first parameter may be a linear function, a logarithmic function, or an exponential function of the at least one configuration parameter, but this is not limited in this embodiment of the present invention. For example, the coefficient of the first parameter may alternatively be another function of the at least one configuration parameter.

For example, in this embodiment of the present invention, the at least one configuration parameter used to calculate the coefficient of the first parameter in the formula for calculating the transmit power of the PUCCH may be a, and the formula for calculating the transmit power of the PUCCH is:

$$P_{PUCCH}(i) = \qquad (15)$$

$$\min\left\{ \begin{array}{c} P_{CMAX,c}(i), \\ P_{0\_PUCCH} + PL_c + \dfrac{h(n_{CQI}, n_{HARQ}, n_{SR})}{\alpha} + \Delta_{F\_PUCCH}(F) + \\ \Delta_{TxD}(F') + g(i) \end{array} \right\}$$

It should be noted that, the formula (15) is used only as an example to describe the technical solution in this embodiment of the present invention, and is not construed as any limitation on this embodiment of the present invention. The coefficient of the first parameter may alternatively be $\log_{10} \alpha$, $$\frac{\alpha}{C},$$

(C is any constant), or the like. In addition, the at least one configuration parameter may alternatively be $\beta=1$ corresponding to the quantity information of the RM code, for example, $N_{RM}=2$; may be $\gamma=1.5$ corresponding to the quantity information of the OCC, for example, $N_{OCC}=1$; may be $\delta=1$ corresponding to the coding format information, for example, CF=TC; may be $\varepsilon=1$ corresponding to the modulation format information, for example, MF=QPSK; or may be $\omega=-1$ corresponding to the value information of the SF, for example, SF=6. For brevity of description, details are not described herein.

It should be further noted that, the foregoing parameter information may alternatively be used as a coefficient of another first parameter in the formula for calculating the transmit power of the PUCCH, or the parameter information may be used as coefficients of multiple first parameters, and forms of the coefficients of the first parameters may be the same or different.

For another example, in this embodiment of the present invention, the at least one configuration parameter used to calculate the coefficient of the first parameter in the formula for calculating the transmit power of the PUCCH may be $\alpha$, $\beta$, and $\gamma$. The at least one configuration parameter is used as coefficients of multiple first parameters, and the formula for calculating the transmit power of the PUCCH is:

$$P_{PUCCH}(i) = \qquad (16)$$

$$\min\left\{ \begin{array}{c} P_{CMAX,c}(i), \\ P_{0\_PUCCH} + PL_c + \dfrac{h(n_{CQI}, n_{HARQ}, n_{SR})}{\alpha} + \dfrac{\beta}{3}\Delta_{F\_PUCCH}(F) + \\ 2^{\gamma}\Delta_{TxD}(F') + g(i) \end{array} \right\}$$

The parameter information may alternatively be used as a coefficient of one first parameter, and the formula for calculating the transmit power of the PUCCH is:

$$P_{PUCCH}(i) = \qquad (17)$$

$$\min\left\{ \begin{array}{c} P_{CMAX,c}(i), \\ P_{0\_PUCCH} + PL_c + h(n_{CQI}, n_{HARQ}, n_{SR}) + \\ \left[10\log_{10}\alpha + 2\lambda + \dfrac{\beta}{3}\right]\Delta_{F\_PUCCH}(F) + \Delta_{TxD}(F') + g(i) \end{array} \right\}$$

It should be noted that, the formula (16) and the formula (17) are used only as examples to describe the technical solution in this embodiment of the present invention, and are not construed as any limitation on this embodiment of the present invention. The coefficient of the first parameter may alternatively be another function of the parameter information. In addition, the at least one configuration parameter may alternatively be a combination of any multiple configuration parameters in the following six configuration parameters: $\alpha=1$ corresponding to the quantity information of the RB, for example, $N_{RB\_PUCCH}=10$; $\beta=1$ corresponding to the quantity information of the RM code, for example, $N_{RM}=2$; $\gamma=1.5$ corresponding to the quantity information of the OCC, for example, $N_{OCC}=1$; $\delta=1$ corresponding to the coding format information, for example, CF=TC; $\varepsilon=1$ corresponding to the modulation format information, for example, MF=QPSK; and $\omega=-1$ corresponding to the value information of the SF, for example, SF=6. For brevity of description, details are not described herein.

It should be further noted that, the foregoing configuration parameter may further replace the coefficient of the first parameter in the formula for calculating the transmit power of the PUCCH. For example, the configuration parameter may replace a coefficient of a first parameter $h(n_{CQI}, n_{HARQ}, n_{SR})$ in the formula for calculating the transmit power of the PUCCH, but this embodiment of the present invention is not limited thereto.

For example, in this embodiment of the present invention, the coefficient of the first parameter $h(n_{CQI}, n_{HARQ}, n_{SR})$ in the formula for calculating the transmit power of the PUCCH may be replaced by another fixed value, and a formula of $h(n_{CQI}, n_{HARQ}, n_{SR})$ the formula for calculating the transmit power of the PUCCH is as follows:

When a PUCCH format is a new format, $$h(n_{CQI}, n_{HARQ}, n_{SR}) = \frac{n_{CQI} + n_{HARQ} + n_{SR} - 1}{5}.$$

The formula in which the coefficient of the first parameter $h(n_{CQI}, n_{HARQ}, n_{SR})$ is set to a fixed value 1/5 is used when the PUCCH format is the new format. The new PUCCH format may be a combination of any multiple types of information in the foregoing six types of information: quantity information $N_{RB\_PUCCH} > 1$ of the RB, quantity information $N_{RM} > 2$ of the RM code, quantity information such as $N_{OCC} > 1$ of the OCC, coding format information TC or TBCC, modulation format information 16QAM or a higher order modulation scheme, and value information such as $SF > 6$ of the SF.

Optionally, in another embodiment of the present invention, in step 120, a transmit power increment of the PUCCH may be calculated according to at least one of the at least one configuration parameter, at least one of the at least one configuration parameter is used as a coefficient of the first parameter, and the transmit power of the PUCCH is calculated according to the first parameter and the at least one configuration parameter. The first parameter includes at least one of the following parameters: channel open-loop power, a path loss, a power control dynamic deviation, and a compensation.

It should be understood that, in this embodiment of the present invention, the increment and the coefficient of the first parameter may be linear functions, logarithmic functions, or exponential functions of the at least one configuration parameter, but this is not limited in this embodiment of the present invention. For example, the increment and the coefficient of the first parameter may alternatively be other functions of the at least one configuration parameter.

It should be further understood that, in this embodiment of the present invention, a parameter configured for the increment may be recorded as a first configuration parameter, a parameter configured for the coefficient of the first parameter may be recorded as a second configuration parameter, and the first configuration parameter and the second configuration parameter are a same parameter or different parameters in the at least one configuration parameter. That is, when the first configuration parameter and the second configuration parameter are a same parameter in the at least one configuration parameter, forms of functions that are respectively used as the increment and the coefficient of the first parameter may be the same or different, and this is not limited in this embodiment of the present invention. Alternatively, when the first configuration parameter and the second configuration parameter are different parameters in the at least one configuration parameter, forms of functions that are respectively used as the increment and the coefficient of the first parameter may be the same or different, and this is not limited in this embodiment of the present invention.

For example, in this embodiment of the present invention, the first configuration parameter used to calculate the increment in the formula for calculating the transmit power of the PUCCH and the second configuration parameter used as the coefficient of the first parameter may be a, and the formula for calculating the transmit power of the PUCCH is:

$$P_{PUCCH}(i) = \min\left\{ \begin{array}{l} P_{CMAX,c}(i), \\ 10\log_{10}\alpha + P_{0\_PUCCH} + PL_c + \frac{h(n_{CQI}, n_{HARQ}, n_{SR})}{\alpha} + \\ \Delta_{F\_PUCCH}(F) + \Delta_{TxD}(F') + g(i) \end{array} \right\} \quad (18)$$

It should be noted that, the formula (18) is used only as an example to describe the technical solution in this embodiment of the present invention, and is not construed as any limitation on this embodiment of the present invention. The increment and/or the coefficient of the first parameter may alternatively be another function of the at least one configuration parameter. In addition, the first configuration parameter and/or the second configuration parameter may alternatively be a combination of any one or more configuration parameters in the following six configuration parameters: $\alpha=1$ corresponding to the quantity information of the RB, for example, $N_{RB\_PUCCH}=10$; $\beta=1$ corresponding to the quantity information of the RM code, for example, $N_{RM}=2$; $\gamma=1.5$ corresponding to the quantity information of the OCC, for example, $N_{OCC}=1$; $\delta=1$ corresponding to the coding format information, for example, CF=TC; $\varepsilon=1$ corresponding to the modulation format information, for example, MF=QPSK; and $\omega=-1$ corresponding to the value information of the SF, for example, SF=6. For brevity of description, details are not described herein.

It should be understood that, a value of a coefficient and/or a value of a parameter that emerges in this embodiment of the present invention are used as examples to describe the technical solution in this embodiment of the present invention, and are not construed as any limitation on the present invention. Obviously, values of these coefficients and/or values of these parameters need to be determined according to a practical situation, and are not limited in this embodiment of the present invention.

FIG. 4 is a schematic flowchart of a power control method 400 according to another embodiment of the present invention. The method 400 shown in FIG. 4 may be executed by a base station, and the method 400 includes the following steps:

410. Determine parameter information of a physical uplink control channel PUCCH, where the parameter information includes one or more of quantity information of a resource block RB, quantity information of a Reed-Muller RM code, quantity information of an orthogonal cover code OCC, coding format information, modulation format information, or value information of a scale factor SF of the PUCCH, or the parameter information includes at least one configuration parameter corresponding to one or more of quantity information of an RB, quantity information of an RM code, quantity information of an OCC, coding format information, modulation format information, or value information of an SF of the PUCCH.

420. Send the parameter information to a terminal, so that the terminal calculates transmit power of the PUCCH according to the parameter information.

Specifically, in this embodiment of the present invention, the determined parameter information may be sent to the terminal, so that the terminal calculates the transmit power of the PUCCH according to the parameter information. Alternatively, the determined at least one configuration parameter corresponding to the one or more of the quantity information of the RB, the quantity information of the RM code, the quantity information of the OCC, the coding format information, the modulation format information, or the value information of the SF of the PUCCH may be sent to the terminal, so that the terminal calculates the transmit power of the PUCCH according to the at least one configuration parameter. Each configuration parameter in the at least one configuration parameter is in a one-to-one correspondence with the parameter information of the physical uplink control channel PUCCH. That is, the parameter information may be any one of the foregoing six types of information, or may be a combination of any multiple types of information in the foregoing six types of information, and there may be one or more configuration parameters corresponding to the parameter information.

Therefore, in the power control method provided in this embodiment of the present invention, parameter information of a PUCCH is sent to a terminal, so that the terminal calculates transmit power of the PUCCH according to the parameter information, so as to resolve a power control problem of the PUCCH that occurs when UCI that supports a maximum of 32 carriers is fed back on the PUCCH.

Figure 5:
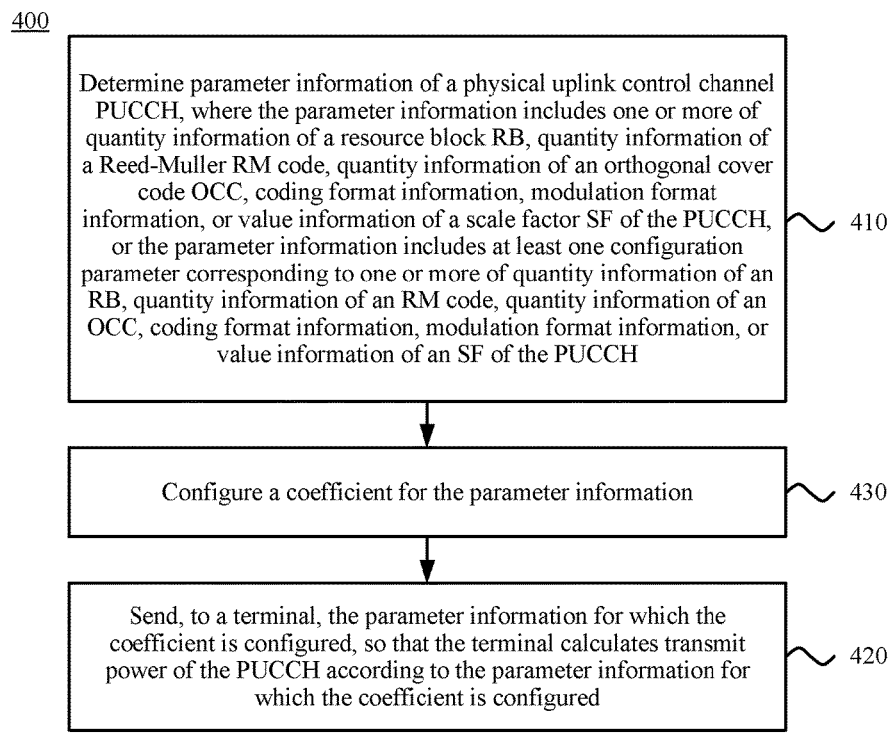
FIG. 5 is a schematic flowchart of a power control method according to another embodiment of the present invention.

Optionally, in an embodiment of the present invention, as shown in FIG. 5, before step 420, the method 400 further includes the following step:

430. Configure a coefficient for the parameter information.

In step 420, the parameter information for which the coefficient is configured may be sent to the terminal, so that the terminal calculates the transmit power of the PUCCH according to the parameter information for which the coefficient is configured.

Specifically, in this embodiment of the present invention, the parameter information of the PUCCH may be determined, the coefficient configured for the parameter information is sent to the terminal, so that the terminal uses, as an increment and/or a coefficient of a first parameter in a formula for calculating the transmit power of the PUCCH, the parameter information for which the coefficient is configured, so as to calculate the transmit power of the PUCCH.

Optionally, in another embodiment of the present invention, the parameter information is the at least one configuration parameter, and in step 410, the at least one configuration parameter may be determined according to a correspondence between the at least one configuration parameter and the parameter information.

It should be understood that, in this embodiment of the present invention, the correspondence may be preconfigured by the base station, or may be obtained from configuration information sent by the terminal, and this is not limited in this embodiment of the present invention.

Figure 6:
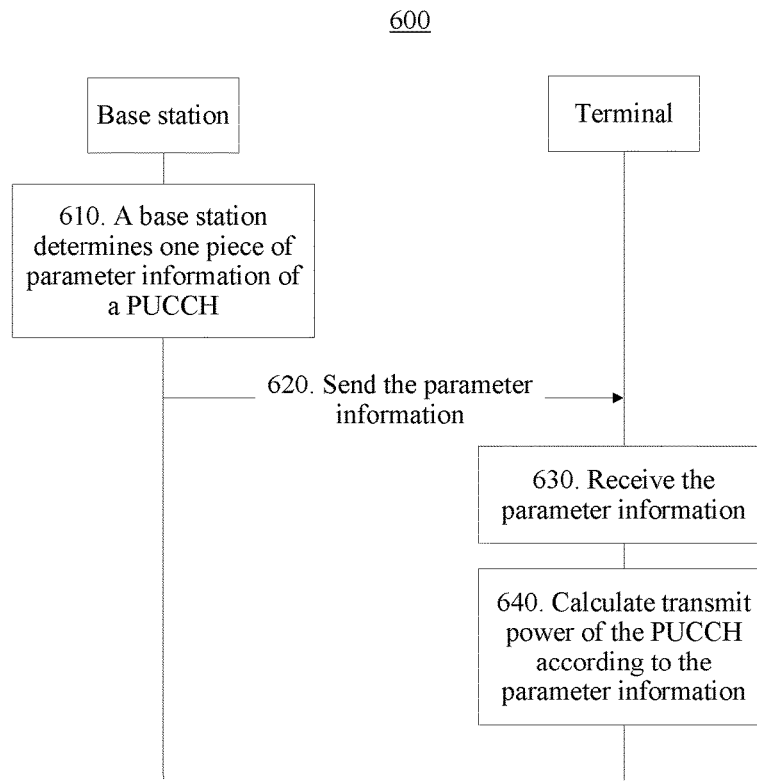
FIG. 6 is a schematic process interaction diagram of a power control method according to an embodiment of the present invention.

The following uses one configuration parameter as an example to describe the technical solution in the embodiment of the present invention in detail with reference to FIG. 6. It should be understood that, this is only an example of the embodiment of the present invention, and is not construed as any limitation on the present invention.

FIG. 6 is a schematic process interaction diagram of a power control method 600 according to an embodiment of the present invention. The method 600 shown in FIG. 6 includes the following steps:

610. A base station determines one piece of parameter information of a physical uplink control channel PUCCH, where the parameter information includes quantity information of a resource block RB, quantity information of an RM code, quantity information of an orthogonal cover code OCC, coding format information, modulation format information, or value information of a scale factor SF of the PUCCH, or the parameter information includes one configuration parameter corresponding to quantity information of an RB, quantity information of an RM code, quantity information of an OCC, coding format information, modulation format information, or value information of an SF of the PUCCH.

620. The base station sends the parameter information to a terminal.

630. The terminal receives the parameter information sent by the base station.

640. The terminal calculates transmit power of the PUCCH according to the parameter information.

Specifically, in this embodiment of the present invention, a formula for calculating the transmit power of the PUCCH includes a first parameter related to a format and content of the PUCCH and a quantity of antenna ports, and the first parameter includes at least one of the following parameters: channel open-loop power, a path loss, a power control dynamic deviation, and a compensation. The base station may determine one piece of parameter information, and send the parameter information to the terminal, so that the terminal uses the parameter information as an increment and/or a coefficient of the first parameter in the formula for calculating the transmit power of the PUCCH, so as to calculate the transmit power of the PUCCH. Specifically, the formula for calculating the transmit power of the PUCCH by using the parameter information as the increment and/or the coefficient of the first parameter in the formula for calculating the transmit power of the PUCCH is similar to any one of formula (1) to formula (12). For brevity of description, details are not described herein.

Alternatively, the base station may determine, according to a correspondence shown in the foregoing Table 2 and Table 3, one configuration parameter corresponding to one piece of parameter information, and send the configuration parameter to the terminal, so that the terminal uses the configuration parameter as an increment and/or a coefficient of the first parameter in the formula for calculating the transmit power of the PUCCH, so as to calculate the transmit power of the PUCCH. Specifically, the formula for calculating the transmit power of the PUCCH by using the parameter information as the increment and/or the coefficient of the first parameter in the formula for calculating the transmit power of the PUCCH is similar to any one of formula (13), formula (15), or formula (18). For brevity of description, details are not described herein.

Therefore, in the power control method provided in this embodiment of the present invention, a base station sends parameter information of a PUCCH to a terminal, so that the terminal calculates transmit power of the PUCCH according to the parameter information, so as to resolve a power control problem of the PUCCH that occurs when UCI that supports a maximum of 32 carriers is fed back on the PUCCH.

It should be understood that, in this embodiment of the present invention, the base station may determine multiple configuration parameters, and the multiple configuration parameters are respectively corresponding to multiple types of information in the quantity information of the resource block RB, the quantity information of the RM code, the quantity information of the orthogonal cover code OCC, the coding format information, the modulation format information, and the value information of the scale factor SF that are included in the parameter information of the PUCCH. The base station may determine, according to a correspondence shown in the foregoing Table 2 and Table 3, a configuration parameter corresponding to each piece of parameter information in multiple pieces of parameter information, and send multiple configuration parameters to the terminal, so that the terminal uses the multiple configuration parameters as the increment and/or the coefficient of the first parameter in the formula for calculating the transmit power of the PUCCH, so as to calculate the transmit power of the PUCCH. Specifically, the formula for calculating the transmit power of the PUCCH by using the parameter information as the increment and/or the coefficient of the first parameter in the formula for calculating the transmit power of the PUCCH is similar to any one of formula (14), formula (16), or formula (17). For brevity of description, details are not described herein.

It should be noted that, the foregoing parameter information may further replace the coefficient of the first parameter in the formula for calculating the transmit power of the PUCCH. For example, the parameter information may replace a coefficient of a first parameter $h(n_{CQI}, n_{HARQ}, n_{SR})$ in the formula for calculating the transmit power of the PUCCH, but this embodiment of the present invention is not limited thereto.

The foregoing describes the power control methods according to the embodiments of the present invention in detail with reference to FIG. 1 to FIG. 6. The following describes a terminal according to embodiments of the present invention in detail with reference to FIG. 7 to FIG. 13.

Figure 7:
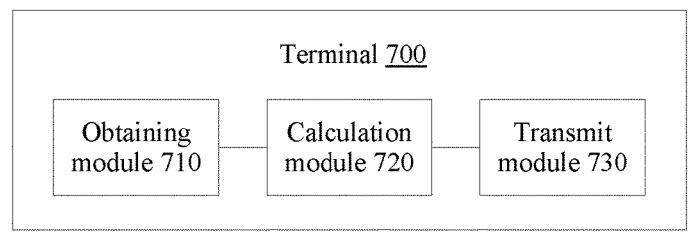
FIG. 7 is a schematic structural block diagram of a terminal according to an embodiment of the present invention.

FIG. 7 is a schematic block diagram of a terminal 700 according to an embodiment of the present invention. The terminal 700 shown in FIG. 7 includes an obtaining module 710, a calculation module 720, and a transmit module 730.

The obtaining module 710 is configured to obtain parameter information of a physical uplink control channel PUCCH, where the parameter information includes one or more of quantity information of a resource block RB, quantity information of a Reed-Muller RM code, quantity information of an orthogonal cover code OCC, coding format information, modulation format information, or value information of a scale factor SF of the PUCCH, or the parameter information includes at least one configuration parameter corresponding to one or more of quantity information of an RB, quantity information of an RM code, quantity information of an OCC, coding format information, modulation format information, or value information of an SF of the PUCCH.

The calculation module 720 is configured to calculate transmit power of the PUCCH according to the parameter information obtained by the obtaining module 710.

The transmit module 730 is configured to transmit the PUCCH according to the transmit power that is of the PUCCH and that is calculated by the calculation module 720.

Specifically, in this embodiment of the present invention, the calculation module 720 may calculate the transmit power of the PUCCH according to the parameter information of the PUCCH that is obtained by the obtaining module 710. The parameter information may include one or more of the quantity information of the resource block RB, the quantity information of the RM code, the quantity information of the orthogonal cover code OCC, the coding format information, the modulation format information, or the value information of the scale factor SF of the PUCCH. That is, the parameter information may be any one of the foregoing six types of information, or may be a combination of any multiple types of information in the foregoing six types of information. When the parameter information includes the coding format information, a first value may be determined according to a correspondence between the coding format information and the first value, to calculate the transmit power of the PUCCH. When the parameter information includes the modulation format information, a second value may be determined according to a correspondence between the modulation format information and the second value, to calculate the transmit power of the PUCCH. Alternatively, the parameter information includes the at least one configuration parameter corresponding to one or more of the quantity information of the RB, the quantity information of the RM code, the quantity information of the OCC, the coding format information, the modulation format information, or the value information of the SF of the PUCCH. That is, the parameter information may be any one of the foregoing six types of information, or may be a combination of any multiple types of information in the foregoing six types of information, and there may be one or more configuration parameters corresponding to the parameter information.

Therefore, according to the terminal provided in this embodiment of the present invention, parameter information of a PUCCH is obtained, and transmit power of the PUCCH is calculated according to the parameter information, so as to resolve a power control problem of the PUCCH that occurs when UCI that supports a maximum of 32 carriers is fed back on the PUCCH.

It should be understood that, in this embodiment of the present invention, the correspondence between the coding format information and the first value and/or the correspondence between the modulation format information and the second value may be preconfigured by the terminal, or may be obtained from configuration information sent by a base station, and this is not limited in this embodiment of the present invention. For example, the correspondence between the coding format information and the first value, and the correspondence between the modulation format information and the second value may be shown in the foregoing Table 1.

It should be further understood that, in this embodiment of the present invention, when the parameter information of the PUCCH is the quantity information of the RB, the quantity information of the RM code, the quantity information of the OCC, the coding format information, the modulation format information, or the value information of the SF, a received configuration parameter sent by the base station is a parameter corresponding to the parameter information. As shown in the foregoing Table 2, each type of information in the foregoing six types of information is corresponding to one parameter. As shown in the foregoing Table 3, different values of a same parameter are corresponding to different physical quantities of a same type of information.

Optionally, in an embodiment of the present invention, the calculation module 720 is specifically configured to: calculate a transmit power increment of the PUCCH according to the parameter information, and calculate the transmit power of the PUCCH according to a first parameter and the increment; or use the parameter information as a coefficient of a first parameter, and calculate the transmit power of the PUCCH according to the first parameter and the parameter information; or calculate a transmit power increment of the PUCCH according to at least one of the parameter information, use the at least one of the parameter information as a coefficient of a first parameter, and calculate the transmit power of the PUCCH according to the first parameter and the parameter information, where the first parameter includes at least one of the following parameters: channel open-loop power, a path loss, a power control dynamic deviation, and a compensation.

It should be noted that, the foregoing parameter information may further replace the coefficient of the first parameter in a formula for calculating the transmit power of the PUCCH. For example, the parameter information may replace a coefficient of a first parameter $h(n_{CQI}, n_{HARQ}, n_{SR})$ in the formula for calculating the transmit power of the PUCCH, but this embodiment of the present invention is not limited thereto.

It should be understood that, in this embodiment of the present invention, the increment and/or the coefficient of the first parameter may be a linear function, a logarithmic function, or an exponential function of the parameter information, but this is not limited in this embodiment of the present invention. For example, the increment and/or the coefficient of the first parameter may alternatively be another function of the parameter information.

It should be further understood that, in this embodiment of the present invention, the at least one piece of parameter information used to calculate the transmit power increment of the PUCCH may be recorded as first parameter information, the at least one piece of parameter information used as the coefficient of the first parameter may be recorded as second parameter information, and the first parameter information and the second parameter information are same or different parameter information. That is, when the first parameter information and the second parameter information are same parameter information, forms of functions that are respectively used as the increment and the coefficient of the first parameter may be the same or different, and this is not limited in this embodiment of the present invention. Alternatively, when the first parameter information and the second parameter information are different parameter information, forms of functions that are respectively used as the increment and the coefficient of the first parameter may be the same or different, and this is not limited in this embodiment of the present invention.

It should be further understood that, in this embodiment of the present invention, specifically, the formula for calculating the transmit power of the PUCCH by using the parameter information as the increment and/or the coefficient of the first parameter in the formula for calculating the transmit power of the PUCCH is similar to any one of formula (1) to formula (12). For brevity of description, details are not described herein.

Figure 8:
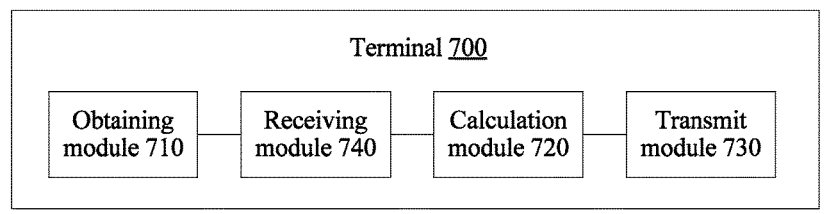
FIG. 8 is another schematic structural block diagram of a terminal according to an embodiment of the present invention.

Optionally, in another embodiment of the present invention, as shown in FIG. 8, the terminal 700 further includes: a receiving module 740, configured to receive a coefficient that is sent by a base station and that is configured for the parameter information.

The calculation module 720 is specifically configured to: calculate a transmit power increment of the PUCCH according to the parameter information for which the coefficient is configured, and calculate the transmit power of the PUCCH according to a first parameter and the increment; or use, as a coefficient of a first parameter, the parameter information for which the coefficient is configured, and calculate the transmit power of the PUCCH according to the first parameter and the parameter information; or calculate a transmit power increment of the PUCCH according to at least one of the parameter information for which the coefficient is configured, use, as a coefficient of a first parameter, at least one of the parameter information for which the coefficient is configured, and calculate the transmit power of the PUCCH according to the first parameter, the increment, and the parameter information for which the coefficient is configured, where the first parameter includes at least one of the following parameters: channel open-loop power, a path loss, a power control dynamic deviation, and a compensation.

Specifically, in this embodiment of the present invention, the obtaining module 710 may obtain the parameter information of the PUCCH, the receiving module 740 receives the coefficient that is sent by the base station and that is configured for the parameter information, and the calculation module 720 may use, as the increment and/or the coefficient of the first parameter in the formula for calculating the transmit power of the PUCCH, the parameter information for which the coefficient is configured, so as to calculate the transmit power of the PUCCH.

Therefore, according to the terminal provided in this embodiment of the present invention, parameter information of a PUCCH is obtained, a coefficient configured by a base station for the parameter information is received, and transmit power of the PUCCH is then calculated according to the parameter information for which the coefficient is configured, so as to resolve a power control problem of the PUCCH that occurs when UCI that supports a maximum of 32 carriers is fed back on the PUCCH. In addition, an adjustment range of the transmit power of the PUCCH can be better controlled, so that the power is more precisely and steadily controlled.

It should be understood that, in this embodiment of the present invention, the base station may correspondingly configure a coefficient for each type of information included in the parameter information. For example, the base station may correspondingly configure coefficients $\alpha$, $\beta$, $\gamma$, $\delta$, $\varepsilon$, and $\omega$ respectively for the quantity information of the RB, the quantity information of the RM code, the quantity information of the OCC, the coding format information, the modulation format information, and the value information of the SF that are included in the parameter information, but this is not limited in this embodiment of the present invention.

It should be further understood that, in this embodiment of the present invention, the increment and/or the coefficient of the first parameter may be a linear function, a logarithmic function, or an exponential function of the parameter information, but this is not limited in this embodiment of the present invention. For example, the increment and/or the coefficient of the first parameter may alternatively be another function of the parameter information.

Optionally, in another embodiment of the present invention, the obtaining module 710 is specifically configured to: receive a configuration parameter sent by the base station, and obtain the parameter information according to a correspondence between the configuration parameter and the parameter information.

Specifically, in this embodiment of the present invention, the configuration parameter sent by the base station may be received, the parameter information is determined according to the correspondence between the configuration parameter and the parameter information, and the parameter information is then used to calculate the increment and/or the coefficient of the first parameter in the formula for calculating the transmit power of the PUCCH, so as to calculate the transmit power of the PUCCH. Alternatively, after the parameter information is determined, a coefficient that is sent by the base station and that is configured for the parameter information may be received, and the parameter information for which the coefficient is configured may be used to calculate the increment and/or the coefficient of the first parameter in the formula for calculating the transmit power of the PUCCH, so as to calculate the transmit power of the PUCCH.

It should be understood that, in this embodiment of the present invention, the correspondence between the configuration parameter and the parameter information may be preconfigured by a terminal, or may be obtained from configuration information sent by the base station, and this is not limited in this embodiment of the present invention.

It should be further understood that, in this embodiment of the present invention, the base station may correspondingly configure a parameter for each type of information included in the parameter information. For example, as shown in the foregoing Table 4, the base station may configure parameters $\alpha$, $\beta$, $\gamma$, $\delta$, $\varepsilon$, and $\omega$ that are respectively corresponding to the quantity information of the RB, the quantity information of the RM code, the quantity information of the OCC, the coding format information, the modulation format information, and the value information of the SF that are included in the parameter information, but this is not limited in this embodiment of the present invention.

For example, in this embodiment of the present invention, a configuration parameter $\alpha=1$ sent by the base station is received, the parameter information may be determined as $N_{RB\_PUCCH}=10$ according to a correspondence between the configuration parameter and the parameter information shown in Table 4, and the parameter information is then used to calculate the increment and/or the coefficient of the first parameter in the formula for calculating the transmit power of the PUCCH, so as to calculate the transmit power of the PUCCH. Specifically, the formula for calculating the transmit power of the PUCCH by using the parameter information as the increment and/or the coefficient of the first parameter in the formula for calculating the transmit power of the PUCCH is similar to any one of formula (1) to formula (12). For brevity of description, details are not described herein.

Optionally, in another embodiment of the present invention, the parameter information is the at least one configuration parameter, the obtaining module 710 may receive the at least one configuration parameter sent by the base station, and each configuration parameter in the at least one configuration parameter is in a one-to-one correspondence with at least one of the quantity information of the RB, the quantity information of the RM code, the quantity information of the OCC, the coding format information, the modulation format information, or the value information of the SF included in the parameter information. That is, the at least one configuration parameter corresponding to the parameter information is obtained.

Specifically, in this embodiment of the present invention, the one-to-one correspondence between at least one of the foregoing six types of information and the at least one configuration parameter may be shown in the foregoing Table 2 and Table 3.

Optionally, in another embodiment of the present invention, the calculation module 720 may calculate a transmit power increment of the PUCCH according to the at least one configuration parameter, and calculate the transmit power of the PUCCH according to a first parameter and the increment; or use the at least one configuration parameter as a coefficient of a first parameter, and calculate the transmit power of the PUCCH according to the first parameter and the at least one configuration parameter; or calculate a transmit power increment of the PUCCH according to at least one of the at least one configuration parameter, use the at least one of the at least one configuration parameter as a coefficient of a first parameter, and calculate the transmit power of the PUCCH according to the first parameter and the at least one configuration parameter, where the first parameter includes at least one of the following parameters: channel open-loop power, a path loss, a power control dynamic deviation, and a compensation.

It should be understood that, in this embodiment of the present invention, the increment and the coefficient of the first parameter may be linear functions, logarithmic functions, or exponential functions of the at least one configuration parameter, but this is not limited in this embodiment of the present invention. For example, the increment and the coefficient of the first parameter may alternatively be other functions of the at least one configuration parameter.

It should be noted that, in this embodiment of the present invention, specifically, the formula for calculating the transmit power of the PUCCH by using the at least one configuration parameter as the increment and/or the coefficient of the first parameter in the formula for calculating the transmit power of the PUCCH is similar to any one of formula (13) to formula (18). For brevity of description, details are not described herein.

It should be understood that, a value of a parameter that emerges in this embodiment of the present invention is used as an example to describe the technical solution in this embodiment of the present invention, and is not construed as any limitation on the present invention. Obviously, values of these parameters need to be determined according to a practical situation, and are not limited in this embodiment of the present invention.

It should be further understood that, in this embodiment of the present invention, the terminal 700 according to this embodiment of the present invention may be corresponding to an entity for executing the method 100 according to the embodiments of the present invention, and the foregoing and other operations and/or functions of the modules in the terminal 700 are respectively for implementing corresponding procedures of the methods in FIG. 1 to FIG. 3. For brevity, details are not described herein again.

Figure 9:
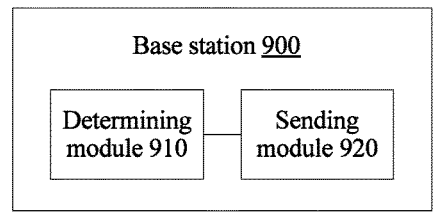
FIG. 9 is a schematic structural block diagram of a base station according to an embodiment of the present invention.

FIG. 9 is a schematic block diagram of a base station 900 according to an embodiment of the present invention. The base station 900 shown in FIG. 9 includes a determining module 910 and a sending module 920.

The determining module 910 is configured to determine parameter information of a physical uplink control channel PUCCH, where the parameter information includes one or more of quantity information of a resource block RB, quantity information of a Reed-Muller RM code, quantity information of an orthogonal cover code OCC, coding format information, modulation format information, or value information of a scale factor SF of the PUCCH, or the parameter information includes at least one configuration parameter corresponding to one or more of quantity information of an RB, quantity information of an RM code, quantity information of an OCC, coding format information, modulation format information, or value information of an SF of the PUCCH.

The sending module 920 is configured to send the parameter information determined by the determining module 910 to a terminal, so that the terminal calculates transmit power of the PUCCH according to the parameter information.

Specifically, in this embodiment of the present invention, the sending module 920 may send the parameter information determined by the determining module 910 to the terminal, so that the terminal calculates the transmit power of the PUCCH according to the parameter information. Alternatively, the determined at least one configuration parameter corresponding to the one or more of the quantity information of the RB, the quantity information of the RM code, the quantity information of the OCC, the coding format information, the modulation format information, or the value information of the SF of the PUCCH may be sent to the terminal, so that the terminal calculates the transmit power of the PUCCH according to the at least one configuration parameter. Each configuration parameter in the at least one configuration parameter is in a one-to-one correspondence with the parameter information of the physical uplink control channel PUCCH. The parameter information may include one or more of the quantity information of the resource block RB, the quantity information of the RM code, the quantity information of the orthogonal cover code OCC, the coding format information, the modulation format information, or the value information of the scale factor SF of the PUCCH. That is, the parameter information may be any one of the foregoing six types of information, or may be a combination of any multiple types of information in the foregoing six types of information, and there may be one or more configuration parameters corresponding to the parameter information.

Therefore, according to the base station provided in this embodiment of the present invention, parameter information of a PUCCH is sent to a terminal, so that the terminal calculates transmit power of the PUCCH according to the parameter information, so as to resolve a power control problem of the PUCCH that occurs when UCI that supports a maximum of 32 carriers is fed back on the PUCCH.

Figure 10:
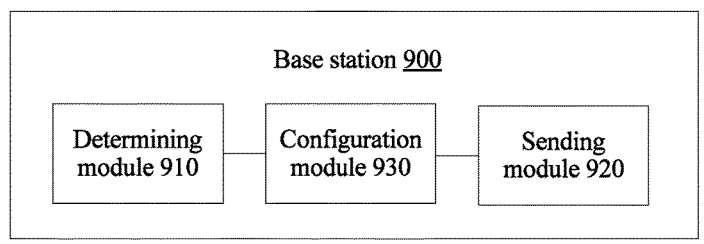
FIG. 10 is another schematic structural block diagram of a base station according to an embodiment of the present invention.

Optionally, in an embodiment of the present invention, as shown in FIG. 10, the base station 900 further includes:

a configuration module 930, configured to configure a coefficient for the parameter information.

The sending module 920 is specifically configured to send, to the terminal, the parameter information for which the coefficient is configured, so that the terminal calculates the transmit power of the PUCCH according to the parameter information for which the coefficient is configured.

Specifically, in this embodiment of the present invention, the determining module 910 may determine the parameter information of the PUCCH, the sending module 920 sends the coefficient configured by the configuration module 930 for the parameter information to the terminal, so that the terminal uses, as an increment and/or a coefficient of a first parameter in a formula for calculating the transmit power of the PUCCH, the parameter information for which the coefficient is configured, so as to calculate the transmit power of the PUCCH.

Optionally, in another embodiment of the present invention, the parameter information is the at least one configuration parameter, and the determining module 910 is specifically configured to determine the at least one configuration parameter according to a correspondence between the at least one configuration parameter and the parameter information.

It should be understood that, in this embodiment of the present invention, the correspondence may be preconfigured by the base station, or may be obtained from configuration information sent by the terminal. For example, the correspondence may be shown in the foregoing Table 2 and Table 3, and this is not limited in this embodiment of the present invention.

It should be further understood that, in this embodiment of the present invention, the base station 900 according to this embodiment of the present invention may be corresponding to an entity for executing the method 400 according to the embodiments of the present invention, and the foregoing and other operations and/or functions of the modules in the base station 900 are respectively for implementing corresponding procedures of the methods in FIG. 4 and FIG. 5. For brevity, details are not described herein again.

Figure 11:
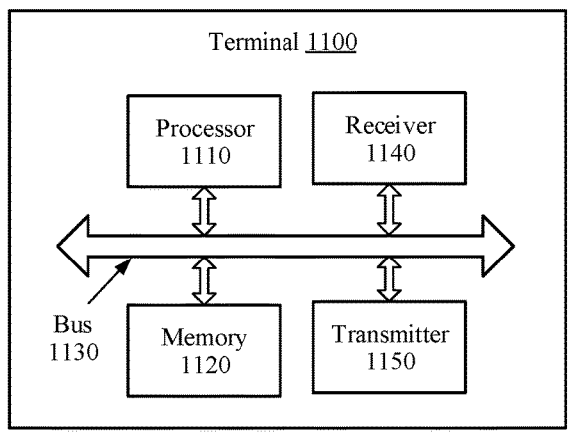
FIG. 11 is a schematic structural block diagram of a terminal according to another embodiment of the present invention.

An embodiment of the present invention further provides a terminal 1100. As shown in FIG. 11, the terminal 1100 includes a processor 1110, a memory 1120, a bus system 1130, a receiver 1140, and a transmitter 1150. The processor 1110, the memory 1120, the receiver 1140, and the transmitter 1150 are connected by using the bus system 1130. The memory 1120 is configured to store an instruction, and the processor 1110 is configured to execute the instruction stored in the memory 1120.

The processor 1110 is configured to: obtain parameter information of a physical uplink control channel PUCCH, where the parameter information includes one or more of quantity information of a resource block RB, quantity information of a Reed-Muller RM code, quantity information of an orthogonal cover code OCC, coding format information, modulation format information, or value information of a scale factor SF of the PUCCH, or the parameter information includes at least one configuration parameter corresponding to one or more of quantity information of an RB, quantity information of an RM code, quantity information of an OCC, coding format information, modulation format information, or value information of an SF of the PUCCH; and calculate transmit power of the PUCCH according to the obtained parameter information.

The transmitter 1150 is configured to transmit the PUCCH according to the calculated transmit power of the PUCCH.

Therefore, according to the terminal provided in this embodiment of the present invention, parameter information of a PUCCH is obtained, and transmit power of the PUCCH is calculated according to the parameter information, so as to resolve a power control problem of the PUCCH that occurs when UCI that supports a maximum of 32 carriers is fed back on the PUCCH.

It should be understood that, in this embodiment of the present invention, when the parameter information includes the coding format information, a first value may be determined according to a correspondence between the coding format information and the first value, to calculate the transmit power of the PUCCH. When the parameter information includes the modulation format information, a second value may be determined according to a correspondence between the modulation format information and the second value, to calculate the transmit power of the PUCCH. The correspondence between the coding format information and the first value and/or the correspondence between the modulation format information and the second value may be preconfigured by the terminal, or may be obtained from configuration information sent by a base station, and this is not limited in this embodiment of the present invention. For example, the correspondence between the coding format information and the first value, and the correspondence between the modulation format information and the second value may be shown in the foregoing Table 1. Alternatively, the parameter information includes the at least one configuration parameter corresponding to one or more of the quantity information of the RB, the quantity information of the RM code, the quantity information of the OCC, the coding format information, the modulation format information, or the value information of the SF of the PUCCH. That is, the parameter information may be any one of the foregoing six types of information, or may be a combination of any multiple types of information in the foregoing six types of information, and there may be one or more configuration parameters corresponding to the parameter information.

It should be understood that, in this embodiment of the present invention, the processor 1110 may be a central processing unit (CPU), or the processor 1110 may be another general purpose processor, a digital signal processor (DSP), an application-specific integrated circuit (ASIC), a field programmable gate array (FPGA), another programmable logic device, a discrete gate or a transistor logic device, a discrete hardware component, or the like. The general purpose processor may be a microprocessor or this processor may be any regular processor, or the like.

The memory 1120 may include a read-only memory and a random access memory, and provide an instruction and data for the processor 1110. A part of the memory 1120 may further include a nonvolatile random access memory. For example, the memory 1120 may further store information about a device type.

In addition to a data bus, the bus system 1130 may further include a power bus, a control bus, a status signal bus, or the like. However, for clarity of description, various buses are marked as the bus system 1130 in the figure.

In an implementation process, steps in the foregoing method may be completed by means of an integrated logic circuit of hardware in the processor 1110 or an instruction in a form of software. The steps of the method disclosed with reference to the embodiments of the present invention may be directly performed by a hardware processor, or may be performed by using a combination of hardware in the processor and a software module. The software module may be located in a mature storage medium in the art, for example, a random access memory, a flash memory, a read-only memory, a programmable read-only memory, an electrically erasable programmable memory, or a register. The storage medium is located in the memory 1120. The processor 1110 reads information in the memory 1120, and completes the steps of the foregoing method in combination with hardware of the processor 1110. To avoid repetition, details are not described herein again.

Optionally, in an embodiment of the present invention, the processor 1110 is specifically configured to: calculate a transmit power increment of the PUCCH according to the parameter information, and calculate the transmit power of the PUCCH according to a first parameter and the increment; or use the parameter information as a coefficient of a first parameter, and calculate the transmit power of the PUCCH according to the first parameter and the parameter information; or calculate a transmit power increment of the PUCCH according to at least one of the parameter information, use the at least one of the parameter information as a coefficient of a first parameter, and calculate the transmit power of the PUCCH according to the first parameter and the parameter information, where the first parameter includes at least one of the following parameters: channel open-loop power, a path loss, a power control dynamic deviation, and a compensation.

It should be noted that, the foregoing parameter information may further replace the coefficient of the first parameter in a formula for calculating the transmit power of the PUCCH. For example, the parameter information may replace a coefficient of a first parameter $h(n_{CQI}, n_{HARQ}, n_{SR})$ in the formula for calculating the transmit power of the PUCCH, but this embodiment of the present invention is not limited thereto.

Optionally, in another embodiment of the present invention, the receiver 1140 is configured to receive a coefficient that is sent by a base station and that is configured for the parameter information.

The processor 1110 is specifically configured to: calculate a transmit power increment of the PUCCH according to the parameter information for which the coefficient is configured, and calculate the transmit power of the PUCCH according to a first parameter and the increment; or use, as a coefficient of a first parameter, the parameter information for which the coefficient is configured, and calculate the transmit power of the PUCCH according to the first parameter and the parameter information; or calculate a transmit power increment of the PUCCH according to at least one of the parameter information for which the coefficient is configured, use, as a coefficient of a first parameter, at least one of the parameter information for which the coefficient is configured, and calculate the transmit power of the PUCCH according to the first parameter, the increment, and the parameter information for which the coefficient is configured, where the first parameter includes at least one of the following parameters: channel open-loop power, a path loss, a power control dynamic deviation, and a compensation.

It should be understood that, in this embodiment of the present invention, the increment and/or the coefficient of the first parameter may be a linear function, a logarithmic function, or an exponential function of the parameter information, but this is not limited in this embodiment of the present invention. For example, the increment and/or the coefficient of the first parameter may alternatively be another function of the parameter information.

Optionally, in another embodiment of the present invention, the processor 1110 is specifically configured to: receive a configuration parameter sent by the base station, and obtain the parameter information according to a correspondence between the configuration parameter and the parameter information.

It should be understood that, in this embodiment of the present invention, the correspondence between the configuration parameter and the parameter information may be preconfigured by a terminal, or may be obtained from configuration information sent by the base station, and this is not limited in this embodiment of the present invention.

It should be noted that, in this embodiment of the present invention, specifically, the formula for calculating the transmit power of the PUCCH by using the parameter information as the increment and/or the coefficient of the first parameter in the formula for calculating the transmit power of the PUCCH is similar to any one of formula (1) to formula (12). For brevity of description, details are not described herein.

Optionally, in another embodiment of the present invention, the parameter information is the at least one configuration parameter, the processor 1110 may be specifically configured to receive the at least one configuration parameter sent by the base station, and each configuration parameter in the at least one configuration parameter is in a one-to-one correspondence with at least one of the quantity information of the RB, the quantity information of the RM code, the quantity information of the OCC, the coding format information, the modulation format information, or the value information of the SF included in the parameter information. That is, the at least one configuration parameter corresponding to the parameter information is obtained.

Specifically, in this embodiment of the present invention, the one-to-one correspondence between at least one of the foregoing six types of information and the at least one configuration parameter may be shown in the foregoing Table 2 and Table 3.

Optionally, in another embodiment of the present invention, the processor 1110 may be specifically configured to: calculate a transmit power increment of the PUCCH according to the at least one configuration parameter, and calculate the transmit power of the PUCCH according to a first parameter and the increment; or use the at least one configuration parameter as a coefficient of a first parameter, and calculate the transmit power of the PUCCH according to the first parameter and the at least one configuration parameter; or calculate a transmit power increment of the PUCCH according to at least one of the at least one configuration parameter, use the at least one of the at least one configuration parameter as a coefficient of a first parameter, and calculate the transmit power of the PUCCH according to the first parameter and the at least one configuration parameter, where the first parameter includes at least one of the following parameters: channel open-loop power, a path loss, a power control dynamic deviation, and a compensation.

It should be understood that, in this embodiment of the present invention, the increment and the coefficient of the first parameter may be linear functions, logarithmic functions, or exponential functions of the at least one configuration parameter, but this is not limited in this embodiment of the present invention. For example, the increment and the coefficient of the first parameter may alternatively be other functions of the at least one configuration parameter.

It should be noted that, in this embodiment of the present invention, specifically, the formula for calculating the transmit power of the PUCCH by using the at least one configuration parameter as the increment and/or the coefficient of the first parameter in the formula for calculating the transmit power of the PUCCH is similar to any one of formula (13) to formula (18). For brevity of description, details are not described herein.

It should be further understood that, in this embodiment of the present invention, the terminal 1100 according to this embodiment of the present invention may be corresponding to an entity for executing the method 100 according to the embodiments of the present invention and the terminal 700 according to the embodiments of the present invention, and the foregoing and other operations and/or functions of the modules in the terminal 1100 are respectively for implementing corresponding procedures of the methods in FIG. 1 to FIG. 3. For brevity, details are not described herein again.

Figure 12:
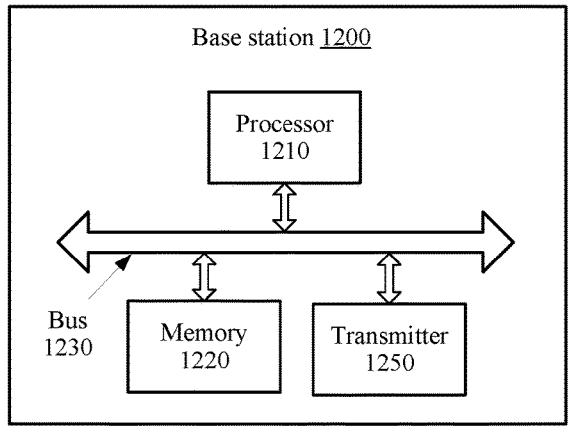
FIG. 12 is a schematic structural block diagram of a base station according to another embodiment of the present invention.

An embodiment of the present invention further provides a base station 1200. As shown in FIG. 12, the base station 1200 includes a processor 1210, a memory 1220, a bus system 1230, and a transmitter 1250. The processor 1210, the memory 1220, and the transmitter 1250 are connected by using the bus system 1230. The memory 1220 is configured to store an instruction, and the processor 1210 is configured to execute the instruction stored in the memory 1220.

The processor 1210 is configured to determine parameter information of a physical uplink control channel PUCCH, where the parameter information includes one or more of quantity information of a resource block RB, quantity information of a Reed-Muller RM code, quantity information of an orthogonal cover code OCC, coding format information, modulation format information, or value information of a scale factor SF of the PUCCH, or the parameter information includes at least one configuration parameter corresponding to one or more of quantity information of an RB, quantity information of an RM code, quantity information of an OCC, coding format information, modulation format information, or value information of an SF of the PUCCH.

The transmitter 1250 is configured to send the parameter information to a terminal, so that the terminal calculates transmit power of the PUCCH according to the parameter information.

Therefore, according to the base station provided in this embodiment of the present invention, parameter information of a PUCCH is sent to a terminal, so that the terminal calculates transmit power of the PUCCH according to the parameter information, so as to resolve a power control problem of the PUCCH that occurs when UCI that supports a maximum of 32 carriers is fed back on the PUCCH.

It should be understood that, in this embodiment of the present invention, the processor 1210 may be a central processing unit (CPU), or the processor 1210 may be another general purpose processor, a digital signal processor (DSP), an application-specific integrated circuit (ASIC), a field programmable gate array (FPGA), another programmable logic device, a discrete gate or a transistor logic device, a discrete hardware component, or the like. The general purpose processor may be a microprocessor or this processor may be any regular processor, or the like.

The memory 1220 may include a read-only memory and a random access memory, and provide an instruction and data for the processor 1210. A part of the memory 1220 may further include a nonvolatile random access memory. For example, the memory 1220 may further store information about a device type.

In addition to a data bus, the bus system 1230 may further include a power bus, a control bus, a status signal bus, or the like. However, for clarity of description, various buses are marked as the bus system 1230 in the figure.

In an implementation process, steps in the foregoing method may be completed by means of an integrated logic circuit of hardware in the processor 1210 or an instruction in a form of software. The steps of the method disclosed with reference to the embodiments of the present invention may be directly performed by a hardware processor, or may be performed by using a combination of hardware in the processor and a software module. The software module may be located in a mature storage medium in the art, for example, a random access memory, a flash memory, a read-only memory, a programmable read-only memory, an electrically erasable programmable memory, or a register. The storage medium is located in the memory 1220. The processor 1210 reads information in the memory 1220, and completes the steps of the foregoing method in combination with hardware of the processor 1210. To avoid repetition, details are not described herein again.

Optionally, in an embodiment of the present invention, the processor 1210 is further configured to configure a coefficient for the parameter information.

The transmitter 1250 is specifically configured to send, to the terminal, the parameter information for which the coefficient is configured, so that the terminal calculates the transmit power of the PUCCH according to the parameter information for which the coefficient is configured.

Optionally, in another embodiment of the present invention, the parameter information is the at least one configuration parameter, and the processor 1210 is specifically configured to determine the at least one configuration parameter according to a correspondence between the at least one configuration parameter and the parameter information.

It should be understood that, in this embodiment of the present invention, the correspondence may be preconfigured by the base station, or may be obtained from configuration information sent by the terminal. For example, the correspondence may be shown in the foregoing Table 2 and Table 3, and this is not limited in this embodiment of the present invention.

It should be further understood that, in this embodiment of the present invention, the base station 1200 according to this embodiment of the present invention may be corresponding to an entity for executing the method 400 according to the embodiments of the present invention and the base station 900 according to the embodiments of the present invention, and the foregoing and other operations and/or functions of the modules in the base station 1200 are respectively for implementing corresponding procedures of the methods in FIG. 4 and FIG. 5. For brevity, details are not described herein again.

A person of ordinary skill in the art may be aware that, in combination with the examples described in the embodiments disclosed in this specification, units and algorithm steps may be implemented by electronic hardware, computer software, or a combination thereof. To clearly describe the interchangeability between the hardware and the software, the foregoing has generally described compositions and steps of each example according to functions. Whether the functions are performed by hardware or software depends on particular applications and design constraint conditions of the technical solutions. A person skilled in the art may use different methods to implement the described functions for each particular application, but it should not be considered that the implementation goes beyond the scope of the present invention.

It may be clearly understood by a person skilled in the art that, for the purpose of convenient and brief description, for a detailed working process of the foregoing system, apparatus, and unit, refer to a corresponding process in the foregoing method embodiments, and details are not described herein again.

In the several embodiments provided in this application, it should be understood that the disclosed system, apparatus, and method may be implemented in other manners. For example, the apparatus embodiments described in the foregoing are merely examples. For example, the unit division is merely logical function division and may be other division during actual implementation. For example, a plurality of units or components may be combined or integrated into another system, or some features may be ignored or not performed.

The foregoing descriptions are merely specific embodiments of the present invention, but are not intended to limit the protection scope of the present invention. Any modification or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A power control method, comprising:
    obtaining parameter information of a physical uplink control channel (PUCCH), wherein the parameter information comprises quantity information of a resource block (RB), coding format information, and value information of a scale factor (SF) of the PUCCH;
    obtaining transmit power of the PUCCH according to the parameter information; and
    transmitting the PUCCH according to the obtained transmit power of the PUCCH.

2. The method according to claim 1, wherein the obtaining the transmit power of the PUCCH according to the parameter information comprises at least one of the following:
    obtaining a transmit power increment of the PUCCH according to the parameter information, and obtaining the transmit power of the PUCCH according to a first parameter and an increment;
    wherein the first parameter comprises at least one of the following parameters: channel open-loop power, a path loss, and a power control dynamic deviation.

3. The method according to claim 2, wherein the increment is a logarithmic function of the parameter information.

4. The method according to claim 1, wherein the obtaining the parameter information of the PUCCH comprises:
    receiving a configuration parameter sent by the base station; and
    obtaining the parameter information according to a correspondence between the configuration parameter and the parameter information;
    wherein the correspondence is preconfigured by a terminal, or is obtained from configuration information sent by the base station.

5. A terminal, comprising:
    a processor; and
    a memory coupled to the processor, the memory having processor-executable instructions stored thereon, which when executed cause the processor to implement operations including:
    obtaining parameter information of a physical uplink control channel (PUCCH), wherein the parameter information comprises quantity information of a resource block (RB), coding format information, and value information of a scale factor (SF) of the PUCCH;
    obtaining transmit power of the PUCCH according to the obtained parameter information; and
    transmitting the PUCCH according to the obtained transmit power that is of the PUCCH.

6. The terminal according to claim 5, wherein the operations further include: obtaining a transmit power increment of the PUCCH according to the parameter information, and obtaining the transmit power of the PUCCH according to a first parameter and an increment; wherein the first parameter comprises at least one of the following parameters: channel open-loop power, a path loss and a power control dynamic deviation.

7. The terminal according to claim 6, wherein the increment is a logarithmic function of the parameter information.

8. The terminal according to claim 5, wherein the operation of obtaining the parameter information of the PUCCH further includes:
    receiving a configuration parameter sent by the base station, and obtaining the parameter information according to a correspondence between the configuration parameter and the parameter information;
    wherein the correspondence is preconfigured by a terminal, or is obtained from configuration information sent by the base station.

9. A base station, comprising:

a processor; and a memory coupled to the processor, the memory having processor-executable instructions stored thereon, which when executed cause the processor to implement operations including:

determining parameter information of a physical uplink control channel (PUCCH), wherein the parameter information comprises quantity information of a resource block (RB), coding format information, and value information of a scale factor (SF) of the PUCCH; and sending the determined parameter information to a terminal;

wherein transmit power of the PUCCH is calculated by the terminal according to the parameter information.

* * * * *